(12) United States Patent
Park et al.

(10) Patent No.: US 11,211,366 B2
(45) Date of Patent: Dec. 28, 2021

(54) METHOD FOR MANUFACTURING DISPLAY DEVICE AND SUBSTRATE FOR MANUFACTURING DISPLAY DEVICE

(71) Applicant: LG ELECTRONICS INC., Seoul (KR)

(72) Inventors: Changseo Park, Seoul (KR); Jinhyung Lee, Seoul (KR); Jungsub Kim, Seoul (KR); Seongmin Moon, Seoul (KR); Younho Heo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/834,315

(22) Filed: Mar. 30, 2020

(65) Prior Publication Data

US 2020/0395345 A1 Dec. 17, 2020

(30) Foreign Application Priority Data

Jun. 11, 2019 (KR) .......................... 10-2019-0068834

(51) Int. Cl.
*H01L 25/075* (2006.01)
*H01L 33/00* (2010.01)
(Continued)

(52) U.S. Cl.
CPC ...... *H01L 25/0753* (2013.01); *H01L 21/6835* (2013.01); *H01L 33/0093* (2020.05);
(Continued)

(58) Field of Classification Search
CPC ............. H01L 25/0753; H01L 33/0093; H01L 21/6835; H01L 33/62; H01L 2221/68354; H01L 2221/68363; H01L 2933/0066; H01L 33/0095; H01L 21/67144; H01L 27/156; H01L 33/44; H01L 25/167
(Continued)

(56) References Cited

U.S. PATENT DOCUMENTS 7,956,382 B2 * 6/2011 Fonstad, Jr. ............ H01L 25/50
  257/183
9,711,443 B2 * 7/2017 Agrawal ................. H01L 23/02
(Continued)

FOREIGN PATENT DOCUMENTS

JP 2013-4792 A 1/2013

*Primary Examiner* — Vu A Vu

(74) *Attorney, Agent, or Firm* — Birch, Stewart, Kolasch & Birch, LLP

(57) ABSTRACT

The present disclosure relates to an assembly substrate used for a display device manufacturing method in which semiconductor light-emitting diodes are placed on the assembly substrate at preset positions using electric field and magnetic field. Specifically, the assembly substrate includes a base portion, a plurality of assembly electrodes extending in one direction and disposed on the base portion, a dielectric layer stacked on the base portion to cover the assembly electrodes, a barrier wall formed on the base portion and having a plurality of recesses for guiding the semiconductor light-emitting diodes to the preset positions, and a metal shielding layer formed on the base portion, wherein the metal shielding layer overlaps the barrier wall so that an electric field formed between the assembly electrodes is shielded.

20 Claims, 16 Drawing Sheets

(51) Int. Cl.
*H01L 21/683* (2006.01)
*H01L 33/62* (2010.01)

(52) U.S. Cl.
CPC .... *H01L 33/62* (2013.01); *H01L 2221/68354* (2013.01); *H01L 2221/68363* (2013.01); *H01L 2933/0066* (2013.01)

(58) Field of Classification Search
USPC .......................................................... 438/28
See application file for complete search history.

(56) References Cited

U.S. PATENT DOCUMENTS

| | | |
|---|---|---|
| 9,825,202 B2 | 11/2017 | Schuele et al. |
| 2007/0087472 A1 | 4/2007 | Huber et al. |
| 2013/0168708 A1 | 7/2013 | Shibata et al. |
| 2017/0104009 A1 | 4/2017 | Peng et al. |
| 2018/0102352 A1 | 4/2018 | Sasaki et al. |

\* cited by examiner 155 154 153 159

155 154 153

159

156   155 154 153

159

METHOD FOR MANUFACTURING DISPLAY DEVICE AND SUBSTRATE FOR MANUFACTURING DISPLAY DEVICE

CROSS-REFERENCE TO RELATED APPLICATION

Pursuant to 35 U.S.C. § 119(a), this application claims the benefit of an earlier filing date of and the right of priority to Korean Application No. 10-2019-0068834, filed on Jun. 11, 2019, the contents of which are incorporated by reference herein in its entirety.

BACKGROUND OF THE DISCLOSURE

1. Field of the Disclosure

The present disclosure relates to a method for manufacturing a display device, and more particularly, to a method for manufacturing a display device using semiconductor light-emitting diodes of several micrometers (μm) to several tens of micrometers, and an assembly substrate used for manufacturing a display device.

2. Background of the Related Art

In recent years, in the field of display technology, liquid-crystal displays (LCD), organic light-emitting diode (OLED) displays, microLED displays, etc. have been competing to realize large-area displays.

Meanwhile, semiconductor microLEDs (μLED) with a diameter or cross-sectional area less than 100 microns, when used in displays, may offer very high efficiency because the displays do not need a polarizer to absorb light. However, large-scale displays require several millions of semiconductor light-emitting diodes, which makes it difficult to transfer the devices compared to other technologies.

Some of the technologies currently in development for the transfer process include pick & place, laser lift-off (LLO), and self-assembly. Among these technologies, the self-assembly approach is a method that allows semiconductor light-emitting diodes to find their positions on their own in a fluid, which is most advantageous in realizing large-screen display devices.

Recently, U.S. Pat. No. 9,825,202 disclosed a microLED structure suitable for self-assembly, but there is not enough research being carried out on technologies for manufacturing displays by the self-assembly of microLEDs. In view of this, the present disclosure proposes a new manufacturing method and device for self-assembling microLEDs.

SUMMARY OF THE DISCLOSURE

One aspect of the present disclosure is to provide a new manufacturing process that provides high reliability in large-screen displays using micro-sized semiconductor light-emitting diodes.

Another aspect of the present disclosure is to provide a manufacturing process, capable of improving transfer accuracy when self-assembling semiconductor light-emitting diodes onto an assembly substrate.

Still another aspect of the present disclosure is to provide a manufacturing process, which facilitates semiconductor light-emitting diodes to be smoothly separated from an assembly substrate after self-assembling the semiconductor light-emitting diodes, and the assembly substrate.

To achieve those aspects and other advantages of the present disclosure, the present disclosure relates to an assembly substrate used for a display device manufacturing method of mounting semiconductor light-emitting diodes on the assembly substrate at preset positions using electric field and magnetic field. Specifically, the assembly substrate may include a base portion, a plurality of assembly electrodes extending in one direction and disposed on the base portion, a dielectric layer stacked on the base portion to cover the assembly electrodes, a barrier wall formed on the base portion and having a plurality of recesses for guiding the semiconductor light-emitting diodes to the preset positions, and a metal shielding layer formed on the base portion, wherein the metal shielding layer overlaps the barrier wall so that an electric field formed between the assembly electrodes is shielded.

In one embodiment, the metal shielding layer may be disposed to overlap at least part of a remaining area, except for areas where the plurality of recesses is formed, of an entire area of the barrier wall.

In one embodiment, the metal shielding layer may be formed on edges of the plurality of recesses.

In one embodiment, the metal shielding layer may cover gaps between the assembly electrodes.

In one embodiment, the metal shielding layer may be disposed between the barrier wall and the dielectric layer.

In one embodiment, the barrier wall may include a first barrier wall formed on the dielectric layer, and a second barrier wall formed on the first barrier wall, and the metal shielding layer may be disposed between the first barrier wall and the second barrier wall.

In one embodiment, the barrier wall may include a first surface in contact with the dielectric layer, and a second surface opposite to the first surface, and the metal shielding layer may be disposed to cover the second surface.

In one embodiment, a sum of a thickness of the barrier wall and a thickness of the metal shielding layer in a direction perpendicular to the assembly substrate may be smaller than a thickness of the semiconductor light-emitting diode mounted in the recess.

In one embodiment, at least one type of insulating material may be disposed between the metal shielding layer and the assembly electrodes so that the insulated state between the metal shielding layer and the assembly electrodes is maintained.

According to another aspect of the present disclosure, there is provided a method of manufacturing a semiconductor light-emitting diode, the method including feeding an assembly substrate having a plurality of assembly electrodes to an assembly site and putting semiconductor light-emitting diodes into a fluid chamber, applying a magnetic force to the semiconductor light-emitting diodes so that the semiconductor light-emitting diodes move in one direction within the fluid chamber, applying a voltage to each of the assembly electrodes such that the semiconductor light-emitting diodes are guided onto preset positions by an electric field formed between the assembly electrodes while the semiconductor light-emitting diodes move along the one direction, and transferring the semiconductor light-emitting diodes placed on the assembly substrate onto a wiring substrate. The assembly substrate may be provided with a metal shielding layer disposed thereon for shielding an electric field so as to prevent the electric field from being formed in areas except for the preset positions.

In one embodiment, the transferring the semiconductor light-emitting diodes, placed on the assembly substrate, to the wiring substrate may include pressing the transfer substrate onto the assembly substrate to transfer the semiconductor light-emitting diodes from the assembly substrate to the transfer substrate, and pressing the transfer substrate onto the wiring substrate to transfer the semiconductor light-emitting diodes from the transfer substrate to the wiring substrate.

In one embodiment, the transfer substrate may include a plurality of protrusions, and the transferring the semiconductor light-emitting diodes from the assembly substrate to the transfer substrate may be performed after aligning the assembly substrate and the transfer substrate so that the protrusions and the semiconductor light-emitting diodes overlap each other.

In one embodiment, the assembly substrate may include a first assembly substrate on which semiconductor light-emitting diodes emitting light of a first color are mounted, and a second assembly substrate on which semiconductor light-emitting diodes emitting light of a second color different from the first color are mounted. The transferring the semiconductor light-emitting diodes, placed on the assembly substrate, to the wiring substrate may include transferring the semiconductor light-emitting diodes, placed on the first assembly substrate and emitting the light of the first color, to the wiring substrate, and transferring the semiconductor light-emitting diodes, placed on the second assembly substrate and emitting the light of the second color, to the wiring substrate.

In one embodiment, the transferring the semiconductor light-emitting diodes, placed on the assembly substrate, to the wiring substrate may include pressing the transfer substrate onto the first assembly substrate to transfer the semiconductor light-emitting diodes emitting the light of the first color from the first assembly substrate to the transfer substrate, pressing the transfer substrate onto the second assembly substrate to transfer the semiconductor light-emitting diodes emitting the light of the second color from the second assembly substrate to the transfer substrate, and pressing the transfer substrate onto the wiring substrate to transfer the semiconductor light-emitting diodes emitting the light of the first and second colors from the transfer substrate to the wiring substrate.

In one embodiment, the transferring the semiconductor light-emitting diodes, placed on the assembly substrate, to the wiring substrate may include pressing a first transfer substrate onto the first assembly substrate to transfer the semiconductor light-emitting diodes emitting the light of the first color from the first assembly substrate to the first transfer substrate, pressing a second transfer substrate onto the second assembly substrate to transfer the semiconductor light-emitting diodes emitting the light of the second color from the second assembly substrate to the second transfer substrate, and pressing the first and second transfer substrates onto the wiring substrate to transfer the semiconductor light-emitting diodes emitting the light of the first and second colors from the first and second transfer substrates to the wiring substrate.

In one embodiment, the transfer substrate may be a polydimethylsiloxane (PDMS) substrate.

Effects of the Disclosure

With the above configuration according to the present disclosure, large numbers of semiconductor light-emitting diodes can be assembled at a time on a display device where individual pixels are made up of microLEDs.

As such, according to the present disclosure, large numbers of semiconductor light-emitting diodes can be pixelated on a small-sized wafer and then transferred onto a large-area substrate. This enables the manufacture of a large-area display device at a low cost.

Moreover, according to the manufacturing method of the present disclosure, a low-cost, high-efficiency, and quick transfer of semiconductor light-emitting diodes can be done, regardless of the sizes or numbers of parts and the transfer area, by simultaneously transferring them in the right positions in a solution by using a magnetic field and an electric field.

Furthermore, the assembling of semiconductor light-emitting diodes by an electric field allows for selective assembling through selective electrical application without any additional equipment or processes. Also, since an assembly substrate is placed on top of a chamber, the substrate can be easily loaded or unloaded, and non-specific binding of semiconductor light-emitting diodes can be prevented.

Additionally, formation of an electric field at unnecessary positions can be prevented by using the assembly substrate according to the present disclosure, thereby improving self-assembly accuracy.

Meanwhile, in the related art, there has been a problem that the thickness of the barrier wall formed on the assembly substrate was inevitably increased in order to prevent an electric field from being formed at unnecessary positions. If the thickness of the barrier wall is increased, a problem may arise that the semiconductor light-emitting diodes cannot be smoothly separated from the assembly substrate in a process after self-assembly. Since the assembly substrate according to the present disclosure comes with a metal shielding layer which completely shields an electric field at unnecessary positions, the thickness of the barrier wall does not need to be increased. Accordingly, the present disclosure enables the semiconductor light-emitting diodes to be smoothly separated from the assembly substrate during the process after the self-assembly.

DETAILED DESCRIPTION OF THE DISCLOSURE

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements may also be present.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a digital signage, a head mounted display (HMD), a desktop computer, and the like. However, it will be readily apparent to those skilled in the art that the configuration according to the embodiments described herein may also be applied to a new product type that will be developed later if the device is a device capable of emitting light.

Figure 1:
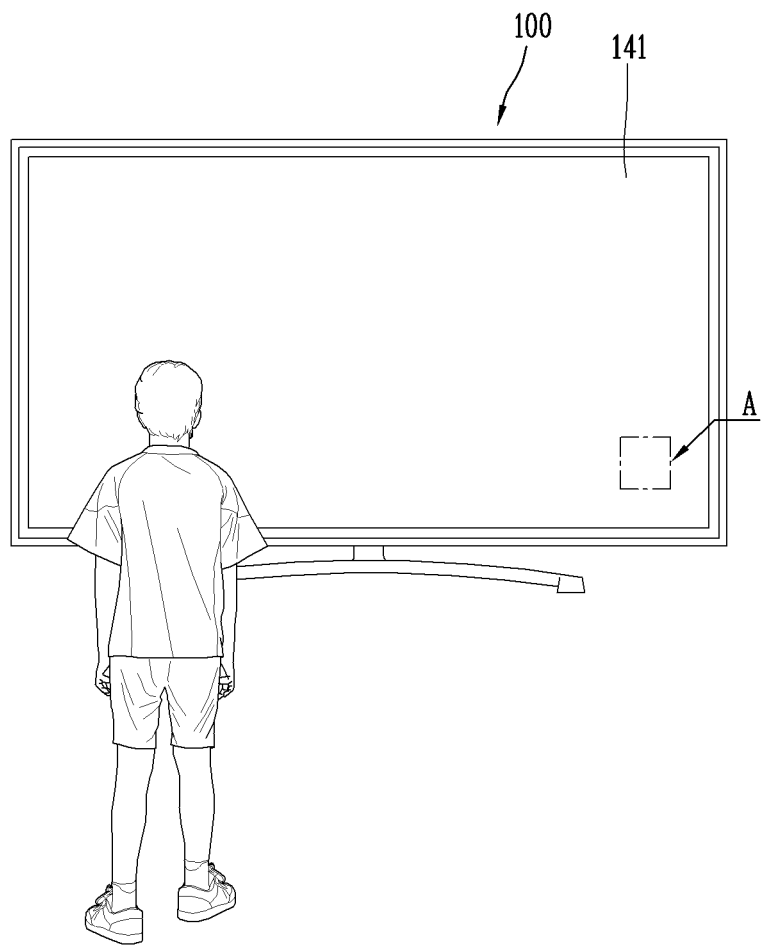
FIG. 1 is a conceptual diagram illustrating one embodiment of a display device using semiconductor light-emitting diodes according to the present disclosure.
Figure 2:
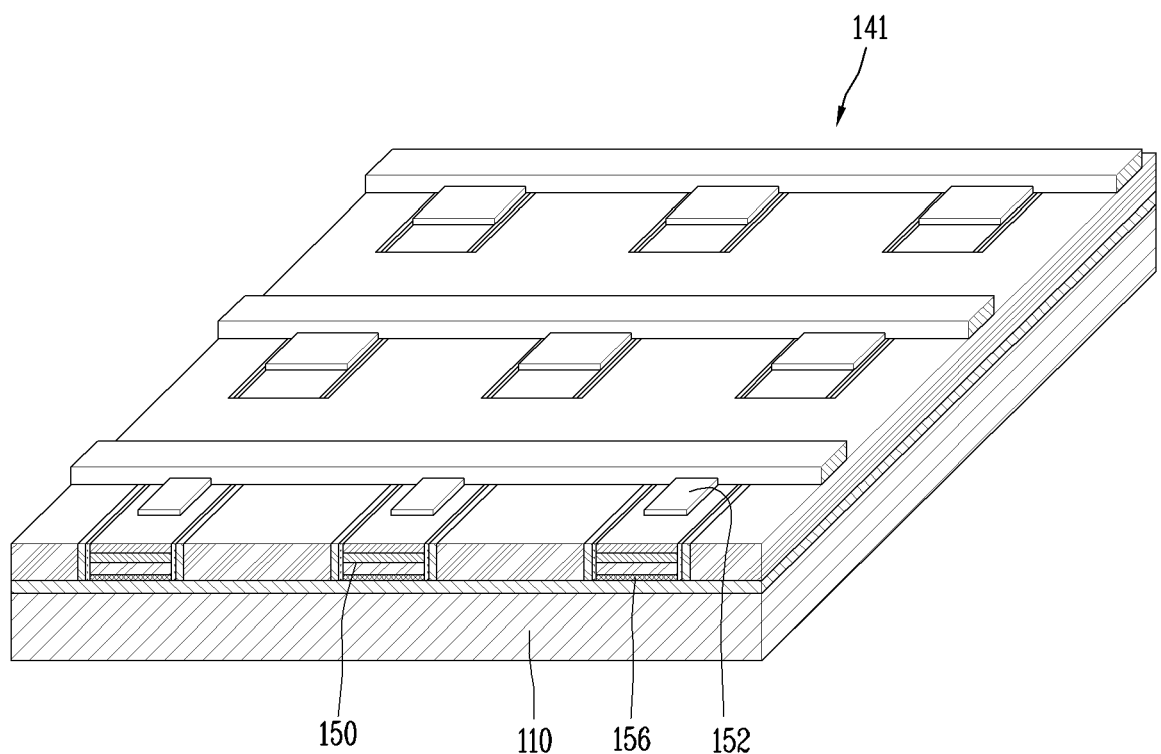
FIG. 2 is a partial enlarged view of the portion A in the display device of FIG. 1.
Figure 3:
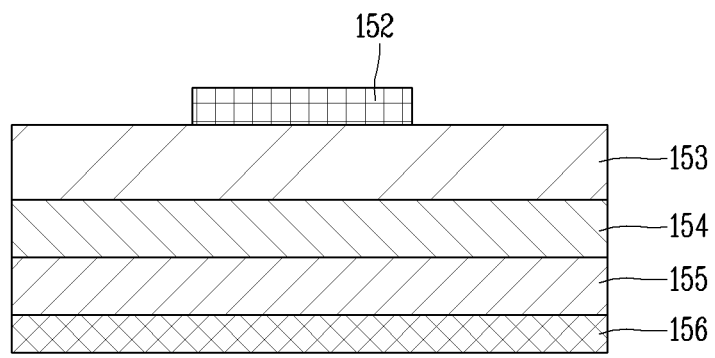
FIG. 3 is an enlarged view of the semiconductor light-emitting diodes of FIG. 2.
Figure 4:
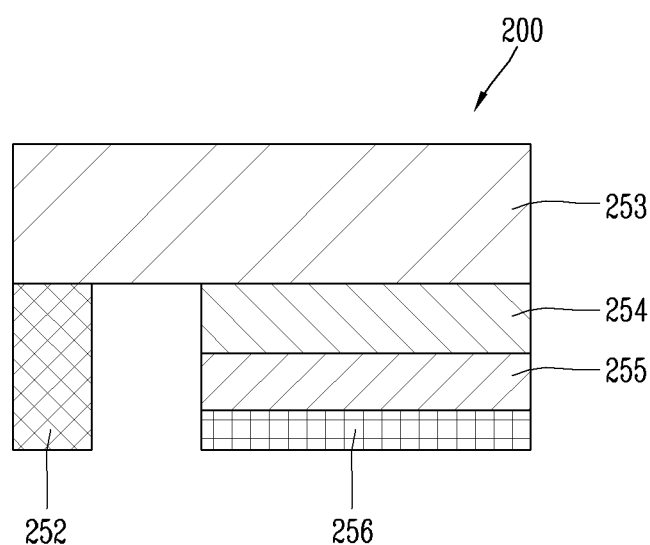
FIG. 4 is an enlarged view illustrating another embodiment of the semiconductor light-emitting diodes of FIG. 2.

FIG. 1 is a conceptual diagram illustrating one embodiment of a display device using semiconductor light-emitting diodes according to the present disclosure, FIG. 2 is a partial enlarged view of the portion A in the display device of FIG. 1, FIG. 3 is an enlarged view of the semiconductor light-emitting diodes of FIG. 2, and FIG. 4 is an enlarged view illustrating another embodiment of the semiconductor light-emitting diodes of FIG. 2.

According to the illustration, information processed by a controller of a display device 100 may be output by a display module 140. A closed loop-shaped case 101 that runs around the edge of the display module may form the bezel of the display device.

The display module 140 comes with a panel 141 that displays an image, and the panel 141 may come with micro-sized semiconductor light-emitting diodes 150 and a wiring substrate 110 where the semiconductor light-emitting diodes 150 are mounted.

The wiring substrate 110 may be formed with wiring lines, which can be connected to n-type electrodes 152 and p-type electrodes 156 of the semiconductor light-emitting diodes 150. As such, the semiconductor light-emitting diodes 150 may be provided on the wiring substrate 110 as individual pixels that emit light on their own.

The image displayed on the panel 141 is visual information, which is rendered by controlling the light emission of unit pixels (sub-pixels) arranged in a matrix independently through the wiring lines.

The present disclosure takes microLEDs (light-emitting diodes) as an example of the semiconductor light-emitting diodes 150 which convert current into light. The microLEDs may be light-emitting diodes that are small in size—less than 100 microns. The semiconductor light-emitting diodes 150 have light-emitting regions of red, green, and blue, and unit pixels can produce light through combinations of these colors. That is, the unit pixels are the smallest units for producing one color. Each unit pixel may contain at least three microLEDs.

More specifically, referring to FIG. 3, the semiconductor light-emitting diode 150 may have a vertical structure.

For example, the semiconductor light-emitting diodes 150 may be implemented as high-power light-emitting diodes that are composed mostly of gallium nitride (GaN), with some indium (In) and/or aluminum (Al) added to it, and emit light of various colors.

Such a vertical semiconductor light-emitting diode comprises a p-type electrode 156, a p-type semiconductor layer 155 formed on the p-type semiconductor layer 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 at the bottom may be electrically connected to a p electrode of the wiring substrate, and the n-type electrode 152 at the top may be electrically connected to an n electrode above the semiconductor light-emitting diode. The electrodes may be disposed in the upward/downward direction in the vertical semiconductor light-emitting diode 150, thereby providing a great advantage capable of reducing the chip size.

In another example, referring to FIG. 4, the semiconductor light-emitting diodes may be flip chip-type light-emitting diodes.

As an example of such a flip chip-type light-emitting diode, the semiconductor light-emitting diode 250 comprises a p-type electrode 256, a p-type semiconductor layer 255 formed on the p-type semiconductor layer 256, an active layer 254 formed on the p-type semiconductor layer 255, an n-type semiconductor layer 253 formed on the active layer 254, and an n-type electrode 252 vertically separated from the p-type electrode 256, on the n-type semiconductor layer 253. In this case, both the p-type electrode 256 and the n-type electrode 252 may be electrically connected to a p electrode and n electrode of the wiring substrate, below the semiconductor light-emitting diode.

The vertical semiconductor light-emitting diode and a horizontal light-emitting diode each may be used as a green semiconductor light-emitting diode, blue semiconductor light-emitting diode, or red semiconductor light-emitting diode. The green semiconductor light-emitting diode and the blue semiconductor light-emitting diode may be implemented as high-power light-emitting diodes that are composed mostly of gallium nitride (GaN), with some indium (In) and/or aluminum (Al) added to it, and emit green and blue light, respectively. As an example of such high-power light-emitting diodes, the semiconductor light-emitting diodes may be composed of gallium nitride thin films which are formed of various layers of n-Gan, p-GaN, AlGaN, InGaN, etc. More specifically, the p-type semiconductor layer may be P-type GaN, and the n-type semiconductor layer may be N-type GaN. However, for the red semiconductor light-emitting diodes, the p-type semiconductor layer may be P-type GaAs, and the n-type semiconductor layer may be N-type GaAs.

Moreover, the p-type semiconductor layer may be P-type GaN doped with Mg on the p electrode, and the n-type semiconductor layer may be N-type GaN doped with Si on the n electrode. In this case, the above-described semiconductor light-emitting diodes may come without the active layer.

Meanwhile, referring to FIGS. 1 to 4, because of the very small size of the light-emitting diodes, self-emissive, high-definition unit pixels may be arranged on the display panel, and therefore the display device can deliver high picture quality.

In the above-explained display device using semiconductor light-emitting diodes according to the present disclosure, semiconductor light-emitting diodes are grown on a wafer, formed through mesa and isolation, and used as individual pixels. In this case, the micro-sized semiconductor light-emitting diodes 150 should be transferred onto a wafer, at preset positions on a substrate of the display panel. One of the transfer technologies available is pick and place, but it has a low success rate and requires a lot of time. In another example, a number of diodes may be transferred at a time by using a stamp or roll, which, however, is not suitable for large-screen displays because of limited yields. The present disclosure suggests a new method and device for manufacturing a display device that can solve these problems.

To this end, the new method for manufacturing a display device will be described first below. FIGS. 5A to 5E are conceptual diagrams for explaining a new process for manufacturing the above-described semiconductor light-emitting diodes.

In this specification, a display device using passive matrix (PM) semiconductor light-emitting diodes will be illustrated. It should be noted that the illustration given below also applies to active matrix (AM) semiconductor light-emitting diodes. Also, although the illustration will be given of how horizontal semiconductor light-emitting diodes are self-assembled, it may also apply to self-assembling of vertical semiconductor light-emitting diodes.

Figure 5A:
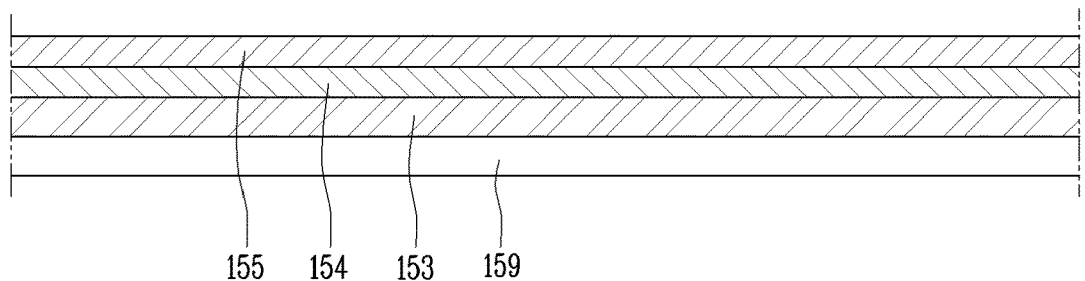
FIGS. 5A to 5E are conceptual diagrams for explaining a new process for manufacturing the above-described semiconductor light-emitting diodes.

First of all, according to the manufacturing method, a first conductive semiconductor layer 153, an active layer 154, and a second conductive semiconductor layer 155 are grown on a growth substrate 159 (FIG. 5A).

Once the first conductive semiconductor layer 153 is grown, then the active layer 154 is grown on the first conductive semiconductor layer 153, and then the second conductive semiconductor layer 155 is grown on the active layer 154. By sequentially growing the first conductive semiconductor layer 153, active layer 154, and second conductive semiconductor layer 155, the first conductive semiconductor layer 153, active layer 154, and second conductive semiconductor layer 155 form a stack structure as shown in FIG. 5A.

In this case, the first conductive semiconductor layer 153 may be a p-type semiconductor layer, and the second conductive semiconductor layer 155 may be an n-type semiconductor layer. However, the present disclosure is not necessarily limited to this, and the first conductive type may be n-type and the second conductive type may be p-type.

Moreover, although this exemplary embodiment is illustrated by assuming the presence of the active layer, the active layer may be omitted if necessary, as stated above. In an example, the p-type semiconductor layer may be P-type GaN doped with Mg, and the n-type semiconductor layer may be N-type GaN doped with Si on the n electrode.

The growth substrate 159 (wafer) may be formed of, but not limited to, light-transmissive material—for example, at least one among sapphire (Al2O3), GaN, ZnO, and AlO. Also, the growth substrate 159 may be made from a material suitable for growing semiconductor materials or carrier wafer. The growth substrate 159 may be formed of a high thermal conducting material, and may be a conductive substrate or insulating substrate—for example, at least one among SiC, Si, GaAs, GaP, InP, and Ga2O3 substrates which have higher thermal conductivity than sapphire (Al2O3) substrates.

Figure 5B:
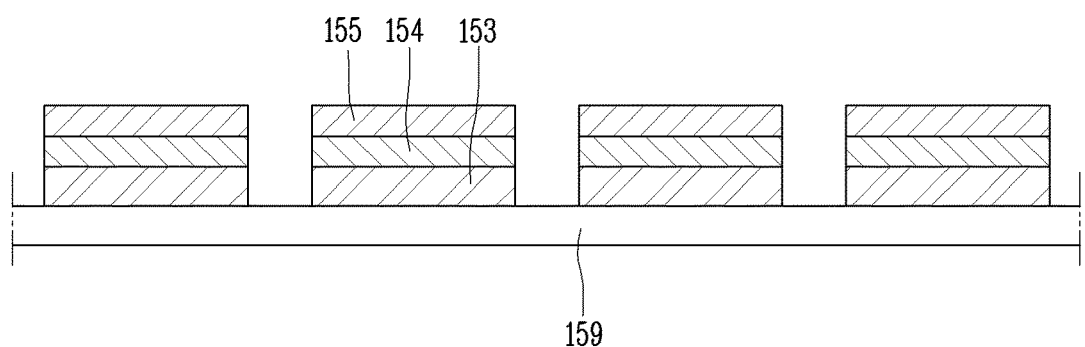

Next, a plurality of semiconductor light-emitting diodes is formed by removing at least part of the first conductive semiconductor layer 153, active layer 154, and second conductive semiconductor layer 155 (FIG. 5B).

More specifically, isolation is performed so that the light-emitting diodes form a light-emitting diode array. That is, a plurality of semiconductor light-emitting diodes is formed by vertically etching the first conductive semiconductor layer 153, active layer 154, and second conductive semiconductor layer 155.

In the case of horizontal semiconductor light-emitting diodes, a mesa process may be performed which exposes the first conductive semiconductor layer 153 to the outside by vertically removing part of the active layer 154 and second conductive layer 155, and then isolation may be performed which forms an array of semiconductor light-emitting diodes by etching the first conductive semiconductor layer 153.

Figure 5C:
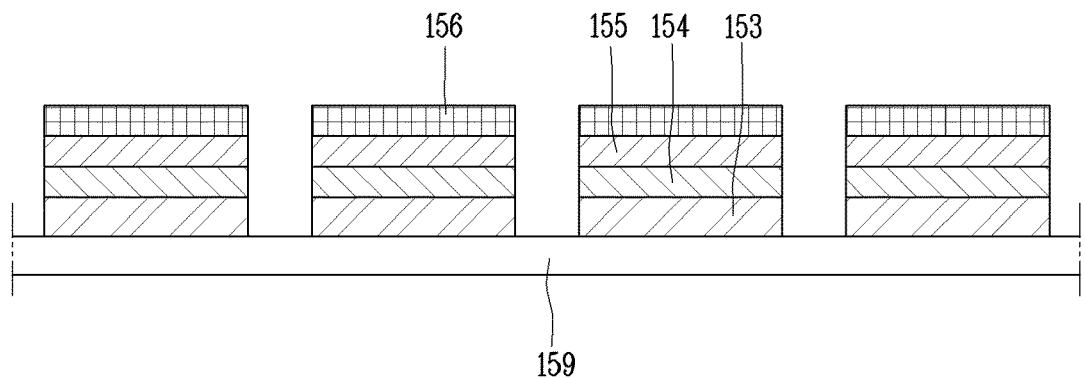

Next, a second conductive electrode 156 (or p-type electrode) is formed on one surface of the second conductive semiconductor layer 155 (FIG. 5C). The second conductive electrode 156 may be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 may serve as an n-type electrode.

Figure 5D:
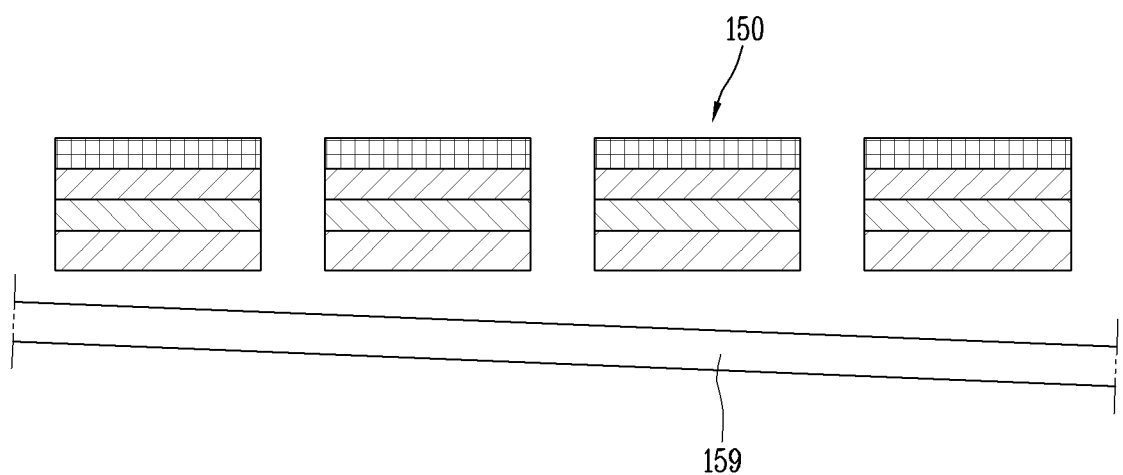

Next, the growth substrate 159 is removed, thus leaving a plurality of semiconductor light-emitting diodes. For example, the growth substrate 159 may be removed using laser lift-off (LLO) or chemical lift-off (CLO) (FIG. 5D).

Figure 5E:
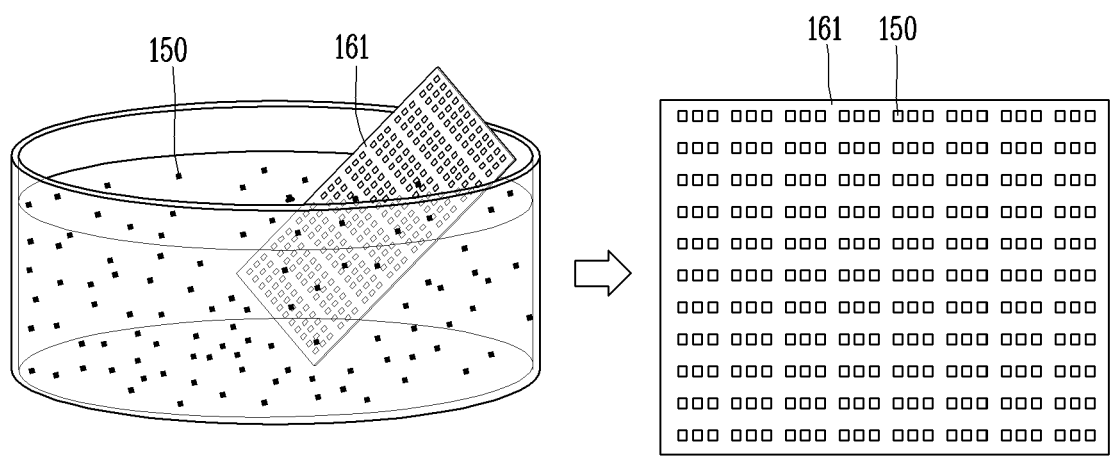

Afterwards, the step of mounting the semiconductor light-emitting didoes 150 on a substrate in a chamber filled with a fluid is performed (FIG. 5E).

For example, the semiconductor light-emitting diodes 150 and the substrate are put into the chamber filled with a fluid, and the semiconductor light-emitting diodes are self-assembled onto the substrate 161 using fluidity, gravity, surface tension, etc. In this case, the substrate may be an assembly substrate 161.

In another example, a wiring substrate, instead of the assembly substrate 161, may be put into a fluid chamber, and the semiconductor light-emitting diodes 150 may be mounted directly onto the wiring substrate. In this case, the substrate may be a wiring substrate. For convenience of explanation, the present disclosure is illustrated with an example in which the semiconductor light-emitting diodes 150 are mounted onto the assembly substrate 161.

To facilitate the mounting of the semiconductor light-emitting diodes 150 onto the assembly substrate 161, cells (not shown) into which the semiconductor light-emitting diodes 150 are fitted may be provided on the assembly substrate 161. Specifically, cells where the semiconductor light-emitting diodes 150 are mounted are formed on the assembly substrate 161, at positions where the semiconductor light-emitting diodes 150 are aligned with wiring electrodes. The semiconductor light-emitting diodes 150 are assembled to the cells as they move within the fluid.

After arraying the semiconductor light-emitting didoes on the assembly substrate 161, the semiconductor light-emitting diodes may be transferred to the wiring substrate from the assembly substrate 161, thereby enabling a large-area transfer across a large area. Thus, the assembly substrate 161 may be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material is placed on the semiconductor light-emitting diodes so that the semiconductor light-emitting diodes are moved by magnetic force, and the semiconductor light-emitting diodes are mounted at preset positions by an electric field while in the process of being moved. This transfer method and device will be described in more details below with reference to the accompanying drawings.

Figure 6:
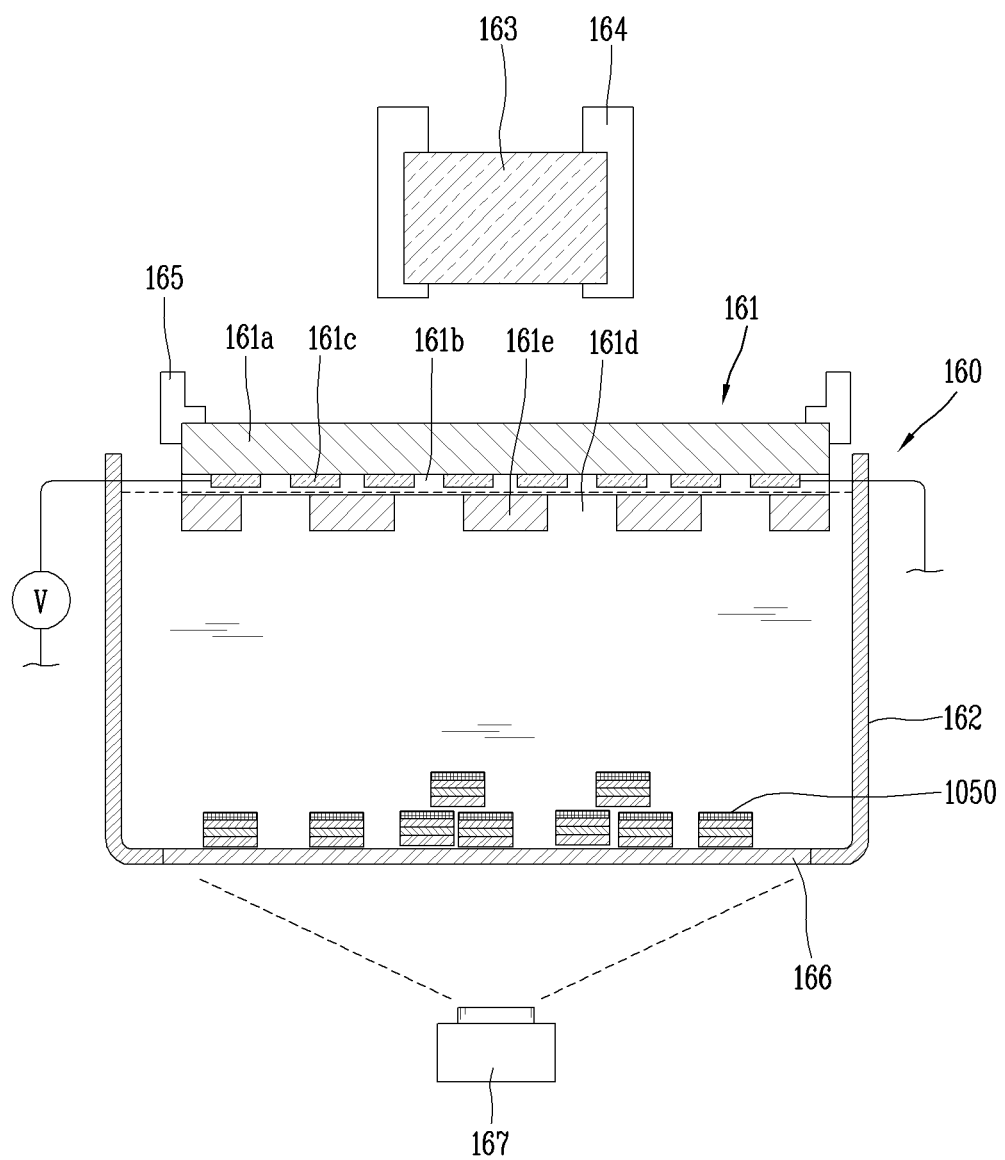
FIG. 6 is a conceptual diagram illustrating an example of a device for self-assembling semiconductor light-emitting diodes according to the present disclosure.
Figure 7:
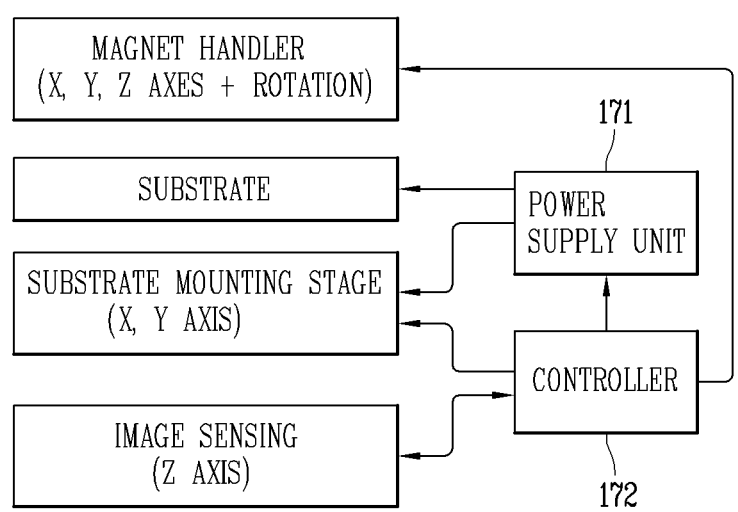
FIG. 7 is a block diagram of the self-assembly device of FIG. 6.

FIG. 6 is a conceptual diagram showing an example of a device for self-assembling semiconductor light-emitting diodes according to the present disclosure, and FIG. 7 is a block diagram of the self-assembly device of FIG. 6. FIGS. 8A to 8E are conceptual diagrams showing a process for self-assembling semiconductor light-emitting diodes using the self-assembly device of FIG. 6. FIG. 9 is a conceptual diagram for explaining the semiconductor light-emitting diodes of FIGS. 8A to 8E.

Referring to FIGS. 6 and 7, the self-assembly device 160 of the present disclosure may comprise a fluid chamber 162, magnets 163, and a position controller 164.

The fluid chamber 162 is equipped with space for a plurality of semiconductor light-emitting diodes. The space may be filled with a fluid, and the fluid may be an assembly solution, which includes water or the like. Thus, the fluid chamber 162 may be a water tank and configured as open-type. However, the present disclosure is not limited to this, and the fluid chamber 162 may be a closed-type chamber that comes with a closed space.

A substrate 161 may be placed in the fluid chamber 162 so that an assembly surface where the semiconductor light-emitting diodes 150 are assembled faces downwards. For example, the substrate 161 is fed to an assembly site by a feed unit, and the feed unit may come with a stage 165 where the substrate is mounted. The position of the stage 165 may be adjusted by the controller, whereby the substrate 161 may be fed to the assembly site.

In this instance, the assembly surface of the substrate 161 at the assembly site faces the bottom of the fluid chamber 162. As shown in the drawings, the assembly surface of the substrate 161 is placed in such a way as to be soaked with the fluid in the fluid chamber 162. Thus, the semiconductor light-emitting diodes 150 in the fluid are moved to the assembly surface.

The substrate 161 is an assembly substrate where an electric field can be formed, and may comprise a base portion 161a, a dielectric layer 161b, and a plurality of electrodes 161c.

The base portion 161a is made of insulating material, and the electrodes 161c may be thin-film or thick-film bi-planar electrodes that are patterned on one surface of the base portion 161a. The electrodes 161c may be formed of a stack of Ti/Cu/Ti, Ag paste, ITO, etc.

The dielectric layer 161b may be made of inorganic material such as SiO2, SiNx, SiON, Al2O3, TiO2, HfO2, etc. Alternatively, the dielectric layer 161b may be an organic insulator and composed of a single layer or multi-layers. The thickness of the dielectric layer 161b may range from several tens of nm to several μm.

Further, the substrate 161 according to the present disclosure comprises a plurality of cells 161d that are separated by barrier walls 161e. The cells 161d may be sequentially arranged in one direction and made of polymer material. Also, the barrier walls 161e forming the cells 161d may be shared with neighboring cells 161d. The barrier walls 161e may protrude from the base portion 161a, and the cells 161d may be sequentially arranged in one direction along the barrier walls 161e. More specifically, the cells 161d may be sequentially arranged in column and row directions and have a matrix structure.

As shown in the drawings, the cells 161d may have recesses for containing the semiconductor light-emitting diodes 150, and the recesses may be spaces defined by the barrier walls 161e. The recesses may have a shape identical or similar to the shape of the semiconductor light-emitting diodes. For example, if the semiconductor light-emitting diodes are rectangular, the recesses may be rectangular too. Moreover, although not shown, the recesses formed in the cells may be circular if the semiconductor light-emitting diodes are circular. Further, each cell is configured to contain one semiconductor light-emitting diode. That is, one cell contains one semiconductor light-emitting diode.

Meanwhile, the plurality of electrodes 161c have a plurality of electrode lines that are placed at the bottom of the cells 161d, and the electrode lines may be configured to extend to neighboring cells.

The electrodes 161c are placed on the undersides of the cells 161d, and different polarities may be applied to create an electric field within the cells 161d. To form an electric field, the dielectric layer 161b may form the bottom of the cells 161d while covering the electrodes 161c. With this structure, when different polarities are applied to a pair of electrodes 161c on the underside of each cell 161d, an electric field is formed and the semiconductor light-emitting diodes can be inserted into the cells 161d by the electric field.

The electrodes of the substrate 161 at the assembly site are electrically connected to a power supply 171. The power supply 171 performs the function of generating an electric field by applying power to the electrodes.

As shown in the drawings, the self-assembly device may have magnets 163 for applying magnetic force to the semiconductor light-emitting diodes. The magnets 163 are placed at a distance from the fluid chamber 162 and apply a magnetic force to the semiconductor light-emitting diodes 150. The magnets 163 may be placed to face the opposite side of the assembly surface of the substrate 161, and the positions of the magnets 163 are controlled by the position controller 164 connected to the magnets 163.

The semiconductor light-emitting diodes 1050 may have a magnetic material so that they are moved within the fluid by a magnetic field.

Referring to FIG. 9, a semiconductor light-emitting diode having a magnetic material may comprise a first conductive electrode 1052, a second conductive electrode 1056, a first conductive semiconductor layer 1053 where the first conductive electrode 1052 is placed, a second conductive semiconductor layer 1055 which overlaps the first conductive semiconductor layer 1052 and where the second conductive layer 1056 is placed, and an active layer 1054 placed between the first and second conductive semiconductor layers 1053 and 1055.

Here, the first conductive may refer to p-type, and the second conductive type may refer to n-type, or vice versa. As stated previously, the semiconductor light-emitting diode may be formed without the active layer.

Meanwhile, in the present disclosure, the first conductive electrode 1052 may be formed after the semiconductor light-emitting diode is assembled onto the wiring substrate by the self-assembling of the semiconductor light-emitting diode. Further, in the present disclosure, the second conductive electrode 1056 may comprise a magnetic material. The magnetic material may refer a magnetic metal. The magnetic material may be Ni, SmCo, etc. In another example, the magnetic material may include at least one among Gd-based, La-based, and Mn-based materials.

The magnetic material may be provided in the form of particles on the second conductive electrode 1056. Alternatively, one layer of a conductive electrode comprising a magnetic material may be composed of the magnetic material. An example of this is the second conductive electrode 1056 of the semiconductor light-emitting diode 1050 which comprises a first layer 1056a and a second layer 1056b, as shown in FIG. 9. Here, the first layer 1056a may comprise a magnetic material, and the second layer 1056b may comprise a metal material other than the magnetic material.

As shown in the drawing, in this example, the first layer 1056a comprising the magnetic material may be placed in contact with the second conductive semiconductor layer 1055. In this case, the first layer 1056a is placed between the second layer 1056b and the second conductive semiconductor layer 1055. The second layer 1056b may be a contact metal that is connected to the wiring electrode on the wiring substrate. However, the present disclosure is not necessarily limited to this, and the magnetic material may be placed on one surface of the first conductive semiconductor layer.

Referring again to FIGS. 6 and 7, more specifically, on top of the fluid chamber of the self-assembly device, a magnet handler capable of automatically or manually moving the magnets 163 on the x, y, and z axes or a motor capable of rotating the magnets 163 may be provided. The magnet handler and motor may constitute the position controller 164. As such, the magnets 163 may rotate in a horizontal, clockwise, or counterclockwise direction to the substrate 161.

Meanwhile, the fluid chamber 162 may be formed with a light-transmissive bottom plate 166, and the semiconductor light-emitting diodes may be placed between the bottom plate 166 and the substrate 161. An image sensor 167 may be placed opposite the bottom plate 166 so as to monitor the inside of the fluid chamber 162 through the bottom plate 166. The image sensor 167 may be controlled by a controller 172, and may come with an inverted-type lens, CCD, etc. so as to observe the assembly surface of the substrate 161.

The above-explained self-assembly device is configured to use a magnetic field and an electric field in combination. With this, the semiconductor light-emitting diodes are mounted at preset positions on the substrate by an electric field while in the process of being moved by changes in the positions of the magnets. Below, the assembly process using the above-explained self-assembly device will be described in more details.

First of all, a plurality of semiconductor light-emitting diodes 1050 having a magnetic material may be formed through the process explained with reference to FIGS. 5A to 5C. In this case, the magnetic material may be deposited onto the semiconductor light-emitting didoes in the process of forming the second conductive electrode of FIG. 5C.

Figure 8A:
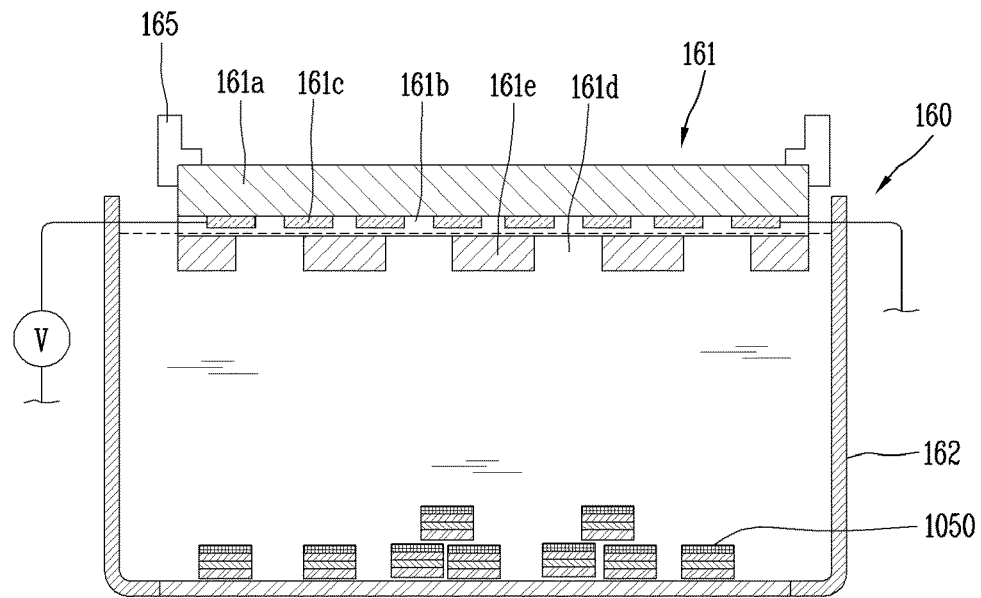
FIGS. 8A to 8E are conceptual diagrams illustrating a process for self-assembling semiconductor light-emitting diodes using the self-assembly device of FIG. 6.
Figure 9:
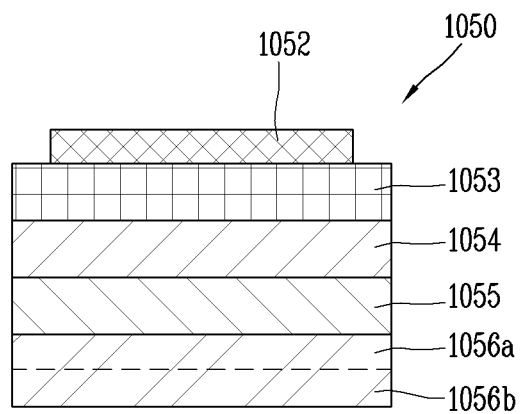
FIG. 9 is a conceptual diagram for explaining the semiconductor light-emitting diodes of FIGS. 8A to 8E.

Next, the substrate 161 is fed to an assembly site, and the semiconductor light-emitting diodes 1050 are put into the fluid chamber 162 (FIG. 8A).

As described above, the assembly site on the substrate 161 may be a position at which the substrate 161 is placed in the fluid chamber 162 in such a way that an assembly surface where the semiconductor light-emitting diodes 150 are assembled faces downwards.

In this case, some of the semiconductor light-emitting diodes 1050 may sink to the bottom of the fluid chamber 162 and some of them may float in the fluid. If the fluid chamber 162 comes with a light-transmissive bottom plate 166, some of the semiconductor light-emitting diodes 1050 may sink to the bottom plate 166.

Figure 8B:
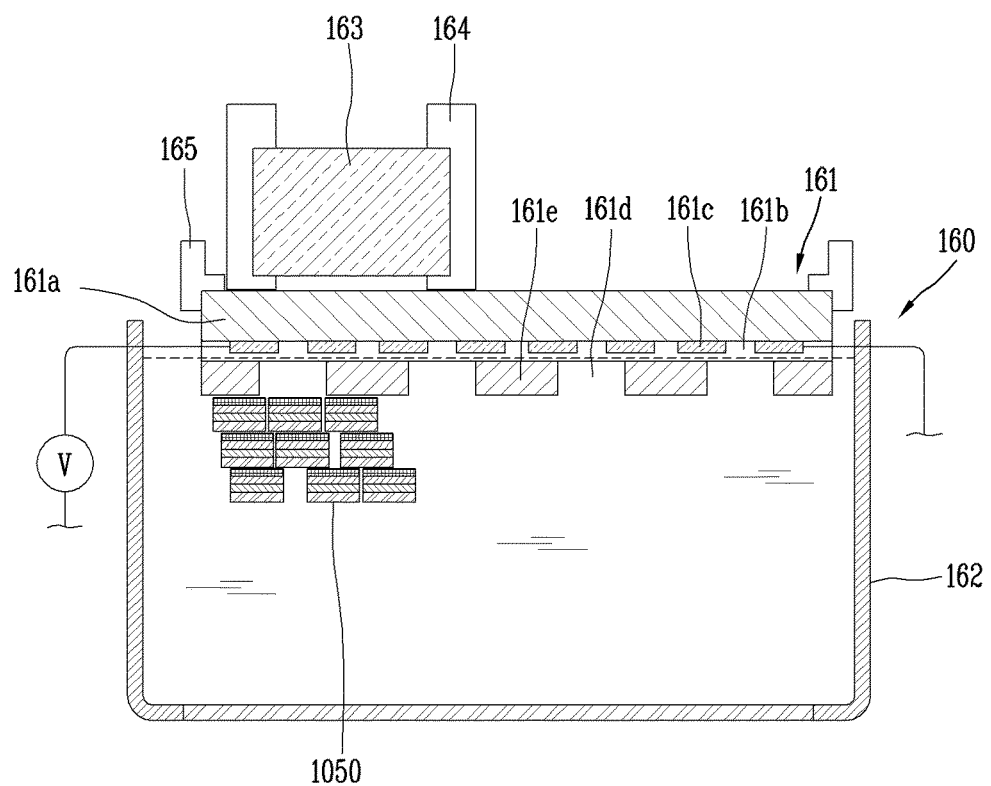

Next, a magnetic force is applied to the semiconductor light-emitting diodes 1050 so that the semiconductor light-emitting diodes 1050 in the fluid chamber 162 come up to the surface (FIG. 8B).

When the magnets 163 of the self-assembly device move to the opposite side of the assembly surface of the substrate 161 from their original positions, the semiconductor light-emitting diodes 1050 float in the fluid towards the substrate 161. The original positions may refer to positions at which the magnets 163 are outside the fluid chamber 162. In another example, the magnets 163 may be composed of electromagnets. In this case, an initial magnetic force is generated by supplying electricity to the electromagnets.

Meanwhile, in this embodiment, the spacing between the assembly surface of the substrate 161 and the semiconductor light-emitting diodes 1050 may be controlled by adjusting the strength of the magnetic force. For example, the spacing is controlled by using the weight, buoyancy, and magnetic force of the semiconductor light-emitting diodes 1050. The spacing may be several millimeters to several tens of micrometers from the outermost part of the substrate 161.

Figure 8C:
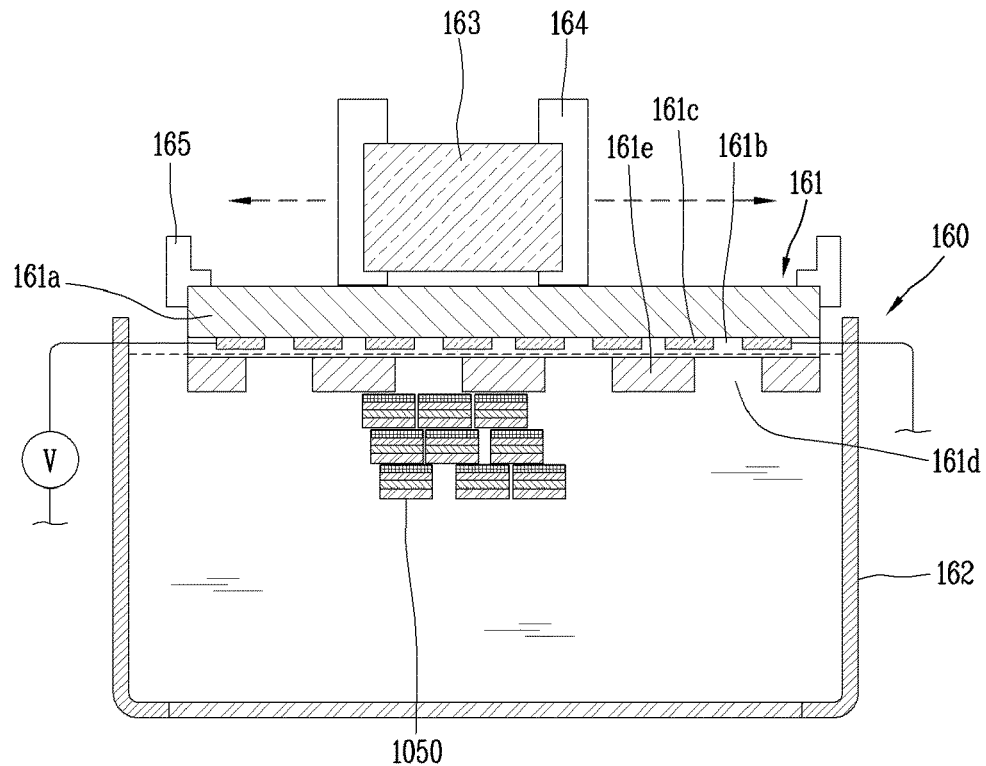

Next, a magnetic force is applied to the semiconductor light-emitting diodes 1050 so that the semiconductor light-emitting diodes 1050 move in one direction within the fluid chamber 162. For example, the magnets 163 may move in a horizontal, clockwise, or counterclockwise direction to the substrate 161 (FIG. 8C). In this case, the semiconductor light-emitting diodes 1050 are moved horizontally to the substrate 161 by the magnetic force, spaced apart from the substrate 161.

Next, the semiconductor light-emitting diodes 1050 are guided to preset positions on the substrate 161 by applying an electric field so that the semiconductor light-emitting diodes 1050 are mounted at the preset positions while in the process of being moved (FIG. 8C). For example, the semiconductor light-emitting diodes 1050 are moved vertically to the substrate 161 by the electric field and mounted at preset positions on the substrate 161, while being moved horizontally to the substrate 161.

More specifically, an electric field is generated by supplying power to bi-planar electrodes on the substrate 161, and the semiconductor light-emitting diodes 1050 are guided to the preset positions and assembled only there by the electric field. That is, the semiconductor light-emitting diodes 1050 are self-assembled at an assembly site on the substrate 161 by a selectively generated electric field. To this end, the substrate 161 may be formed with cells into which the semiconductor light-emitting diodes 1050 are fitted.

Afterwards, the unloading of the substrate 161 is performed, thereby completing the assembly process. In a case where the substrate 161 is an assembly substrate, an array of semiconductor light-emitting diodes may be transferred onto a wiring substrate to carry out a subsequent process for realizing the display device, as described previously.

Figure 8D:
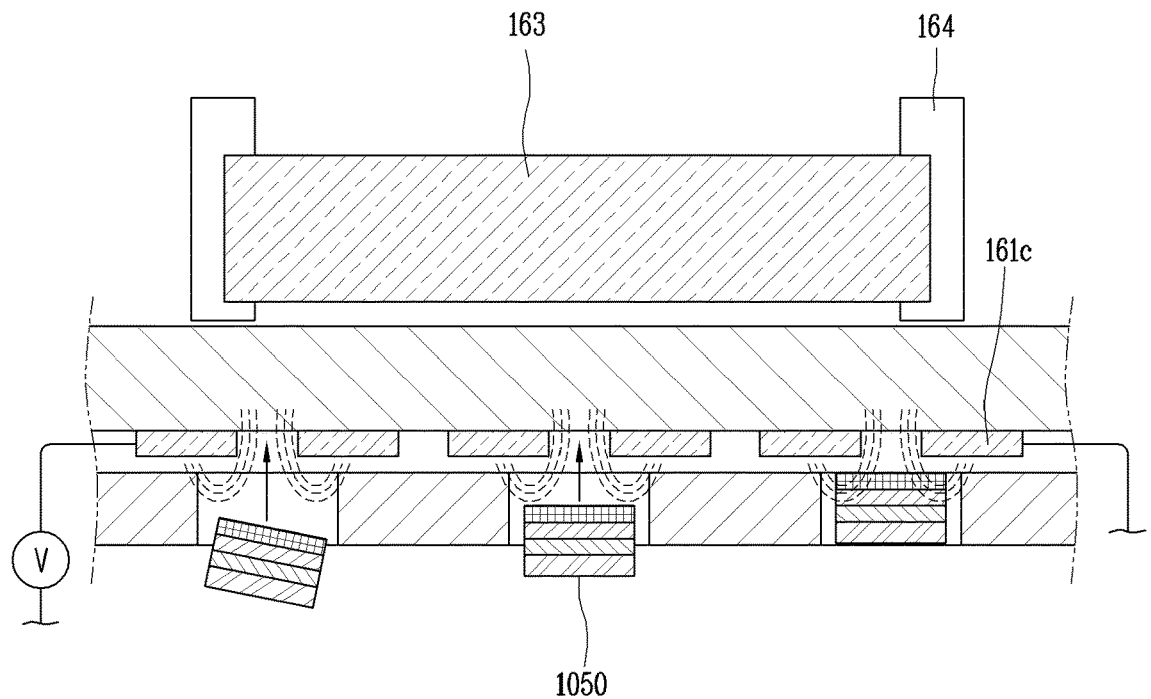
Figure 8E:
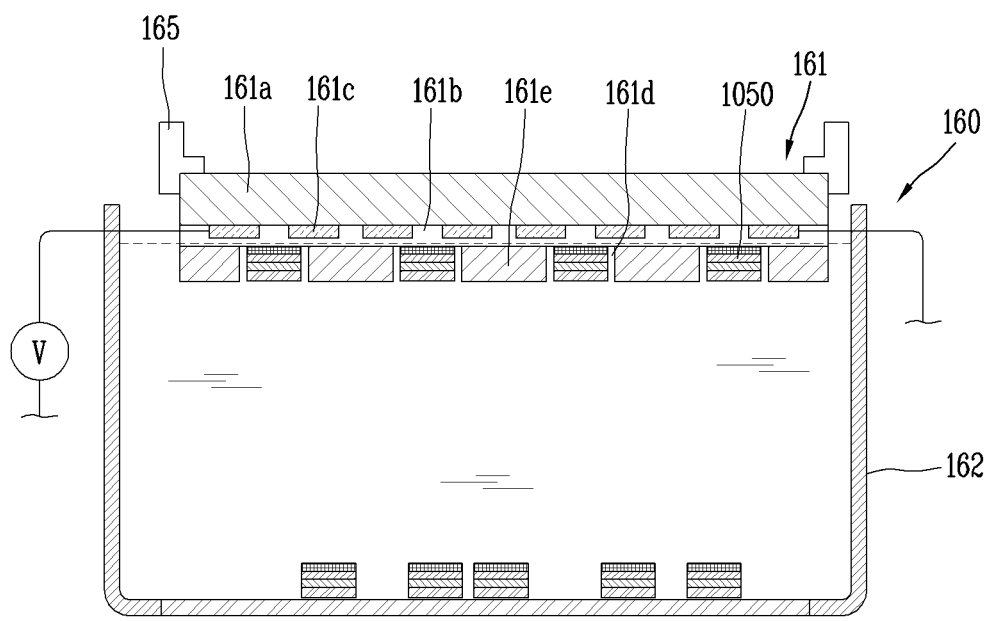

Meanwhile, after the semiconductor light-emitting diodes 1050 are guided to the preset positions, the magnets 163 may be moved in a direction in which they get farther away from the substrate 161, so that the semiconductor light-emitting diodes 1050 remaining in the fluid chamber 162 fall to the bottom of the fluid chamber 162 (FIG. 8D). In another example, if power supply is stopped in a case where the magnets 163 are electromagnets, the semiconductor light-emitting diodes 1050 remaining in the fluid chamber 162 fall to the bottom of the fluid chamber 162.

Thereafter, the semiconductor light-emitting diodes 1050 on the bottom of the fluid chamber 162 may be collected, and the collected semiconductor light-emitting diodes 1050 may be re-used.

In the above-explained self-assembly device and method, parts distant from one another are concentrated near a preset assembly site by using a magnetic field in order to increase assembly yields in a fluidic assembly, and the parts are selectively assembled only at the assembly site by applying an electric field to the assembly site. In this case, the assembly substrate is positioned on top of a water tank, with its assembly surface facing downward, thus minimizing the effect of gravity from the weights of the parts and avoiding non-specific binding and eliminating defects. That is, the assembly substrate is placed on the top to increase transfer yields, thus minimizing the effect of gravity or friction and avoiding non-specific binding.

As seen from above, with the above configuration according to the present disclosure, large numbers of semiconductor light-emitting diodes can be assembled at a time on a display device where individual pixels are made up of semiconductor light-emitting diodes.

As such, according to the present disclosure, large numbers of semiconductor light-emitting diodes can be pixelated on a small-sized wafer and then transferred onto a large-area substrate. This enables the manufacture of a large-area display device at a low cost.

Meanwhile, the present disclosure provides a structure and method of an assembly substrate for increasing the yields of the self-assembly process and the process yields after the self-assembly. The present disclosure is limited to a case where the substrate 161 is used as an assembly substrate. That is, the assemble substrate to be described later is not used as the wiring substrate of the display device. Hereinafter, the substrate 161 is referred to as an assembly substrate 161.

The present disclosure improves the process yields in two respects. First, the present disclosure prevents semiconductor light-emitting diodes from being mounted on undesired positions due to an electric field strongly formed at the undesired positions. Second, the present disclosure prevents the semiconductor light-emitting diodes from remaining on the assemble substrate when transferring the semiconductor light-emitting diodes mounted on the assemble substrate to another substrate.

The above-mentioned objectives are not individually achieved by different components. The above-described two objectives can be achieved by organic coupling of components to be described later and the assembly substrate 161 described above.

Before describing the present disclosure in detail, a post-process for manufacturing a display device after self-assembling will be described.

Figure 10A:
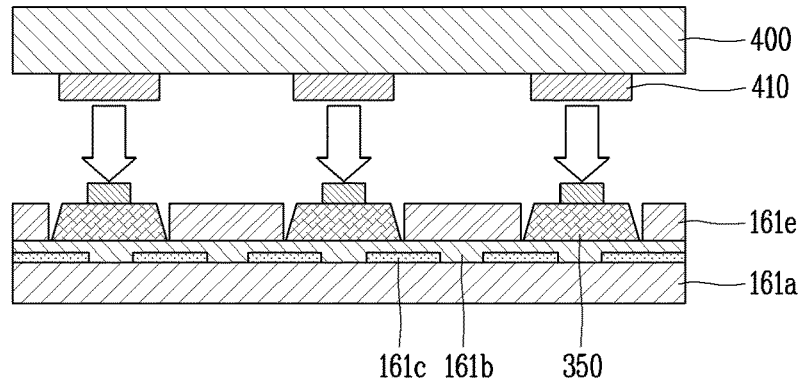
FIGS. 10A to 10O are conceptual diagrams illustrating a state in which the semiconductor light-emitting diodes are transferred after a self-assembling process according to the present disclosure.

FIGS. 10A to 10O are conceptual diagrams illustrating a state in which the semiconductor light emitting devices are transferred after a self-assembling process according to the present disclosure.

When the self-assembly process described with reference to FIGS. 8A to 8E is completed, the semiconductor light-emitting diodes are mounted on the assembly substrate 161 at preset positions. The semiconductor light-emitting diodes mounted on the assembly substrate 161 are transferred at least once to another substrate. This specification illustrates one embodiment in which the semiconductor light-emitting diodes mounted on the assembly substrate 161 are transferred twice, but the present disclosure is not limited thereto. The semiconductor light-emitting diodes mounted on the assembly substrate 161 may be transferred to another substrate once or three times or more.

On the other hand, immediately after the self-assembly process is completed, the assembly surface of the assembly substrate 161 faces downwards (or the gravity direction). For the process after the self-assembly, the assembly substrate 161 may be turned by 180 degrees with the semiconductor light-emitting diodes mounted thereon. In this process, there is a risk that the semiconductor light-emitting diodes are likely to be separated from the assembly substrate 161. Therefore, a voltage must be applied to the plurality of electrodes 161c (hereinafter, referred to as assembly electrodes) while the assembly substrate 161 is turned. An electric field formed between the assembly electrodes prevents the semiconductor light-emitting diodes from being separated from the assembly substrate 161 while the assembly substrate 161 is turned.

When the assembly substrate 161 is turned by 180 degrees after the self-assembly process, a shape as shown in FIG. 10A is made. Specifically, as shown in FIG. 10A, the assembly surface of the assembly substrate 161 is in a state of facing upwards (or the opposite direction to gravity). In this state, a transfer substrate 400 is aligned above the assembly substrate 161.

The transfer substrate 400 is a substrate for separating the semiconductor light-emitting diodes placed on the assembly substrate 161 and transferring them to the wiring substrate. The transfer substrate 400 may be formed of PDMS (polydimethylsiloxane). Accordingly, the transfer substrate 400 may be referred to as a PDMS substrate.

The transfer substrate 400 is aligned above the assembly substrate 161 and then pressed onto the assembly substrate 161. When the transfer substrate 400 is fed above the assembly substrate 161, the semiconductor light-emitting diodes 350 mounted on the assembly substrate 161 are transferred to the transfer substrate 400 by the adhesive force of the transfer substrate 400.

To this end, surface energy between the semiconductor light-emitting diodes 350 and the transfer substrate 400 should be higher than surface energy between the semiconductor light-emitting diodes 350 and the dielectric layer 161b. When there is a greater difference between the surface energy between the semiconductor light-emitting diodes 350 and the transfer substrate 400 and the surface energy between the semiconductor light-emitting diodes 350 and the dielectric layer 161b, the probability that the semiconductor light-emitting diodes 350 are separated from the assembly substrate 161 is more increased. Therefore, it is preferable that the difference between the two surface energies is great.

Meanwhile, the transfer substrate 40 may include a plurality of protrusions 410 that allow pressure applied by the transfer substrate 400 to be concentrated on the semiconductor light-emitting diodes 350 when pressing the transfer substrate 400 onto the assembly substrate 161. The protrusions 410 may be formed at the same interval as the semiconductor light-emitting diodes mounted on the assembly substrate 161. When the transfer substrate 400 is pressed onto the assembly substrate 161 after the protrusions 410 are aligned to overlap the semiconductor light-emitting diodes 350, the pressure applied by the transfer substrate 400 can be concentrated only on the semiconductor light-emitting diodes 350. Thus, the present disclosure increases the probability that the semiconductor light-emitting diodes are separated from the assembly substrate 161.

Meanwhile, in a state where the semiconductor light-emitting diodes are mounted on the assembly substrate 161, parts of the semiconductor light-emitting diodes are preferably exposed to the outside of the recesses. If the semiconductor light-emitting diodes 350 are not exposed to the outside of the recesses, the pressure applied by the transfer substrate 400 is not concentrated on the semiconductor light-emitting diodes 350, which may lower the probability that the semiconductor light-emitting diodes 350 are separated from the assembly substrate 161.

Lastly, referring to FIG. 10O, the step of pressing the transfer substrate 400 onto the wiring substrate 500 and transferring the semiconductor light-emitting diodes 350 from the transfer substrate 400 to the wiring substrate 500 is carried out. At this time, the wiring substrate 500 may be provided with protrusions 510. The transfer substrate 400 and the wiring substrate 500 are aligned so that the semiconductor light-emitting diodes 350 disposed on the transfer substrate 400 overlap the protrusions 510. Thereafter, when the transfer substrate 400 is pressed onto the wiring substrate 500, the probability that the semiconductor light-emitting diodes 350 are separated from the transfer substrate 400 may increase due to the protrusions 510.

On the other hand, in order for the semiconductor light-emitting diodes 350 disposed on the transfer substrate 400 to be transferred to the wiring to substrate 500, surface energy between the semiconductor light-emitting diodes 350 and the wiring substrate 500 should be higher than surface energy between the semiconductor light-emitting diodes 350 and the transfer substrate 400. When there is a greater difference between the surface energy between the semiconductor light-emitting diodes 350 and the wiring substrate 500 and the surface energy between the semiconductor light-emitting diodes 350 and the transfer substrate 400, the probability that the semiconductor light-emitting diodes 350 are separated from the transfer substrate 400 is more increased. Therefore, it is preferable that the difference between the two surface energies is great.

After all the semiconductor light-emitting diodes 350 mounted on the transfer substrate 400 are transferred onto the wiring substrate 500, the step of establishing electrical connection between the semiconductor light-emitting diodes 350 and wiring electrodes provided on the wiring substrate may be performed. The structure of the wiring electrodes and the method of establishing the electrical connection may vary depending on the type of the semiconductor light-emitting diodes 350.

Although not shown, an anisotropic conductive film may be disposed on the wiring substrate 500. In this case, the electrical connection can be established between the semiconductor light-emitting diodes 350 and the wiring electrodes formed on the wiring substrate 500, simply by pressing the transfer substrate 400 onto the wiring substrate 500.

On the other hand, when manufacturing a display device including semiconductor light-emitting diodes emitting light of different colors, the method described in FIGS. 10A to 10O can be implemented in various ways. Hereinafter, a method for manufacturing a display device including semiconductor light-emitting diodes that emit red (R), green (G), and blue (B) light will be described.

Figure 11:
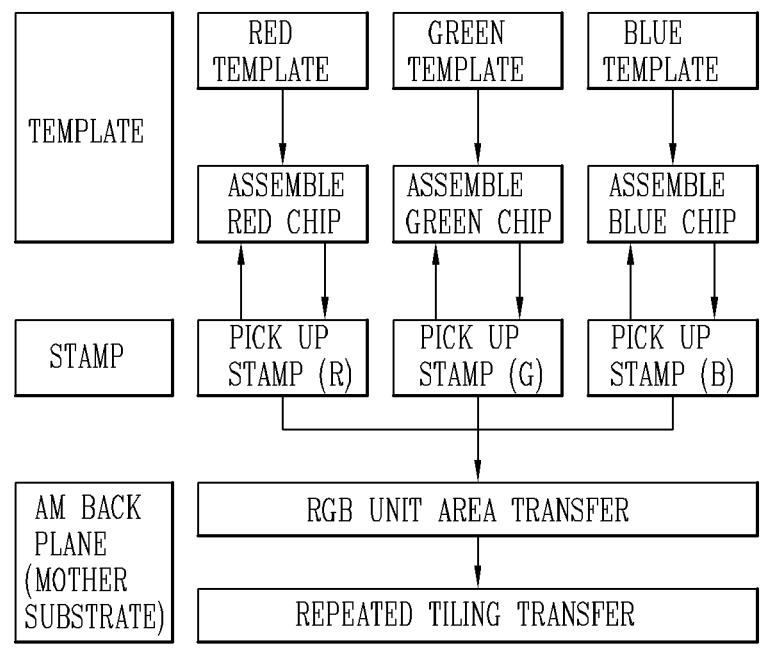
FIGS. 11 to 13 are flowcharts illustrating a method for manufacturing a display device including semiconductor light-emitting diodes that emit red (R), green (G), and blue (B) light.
Figure 12:
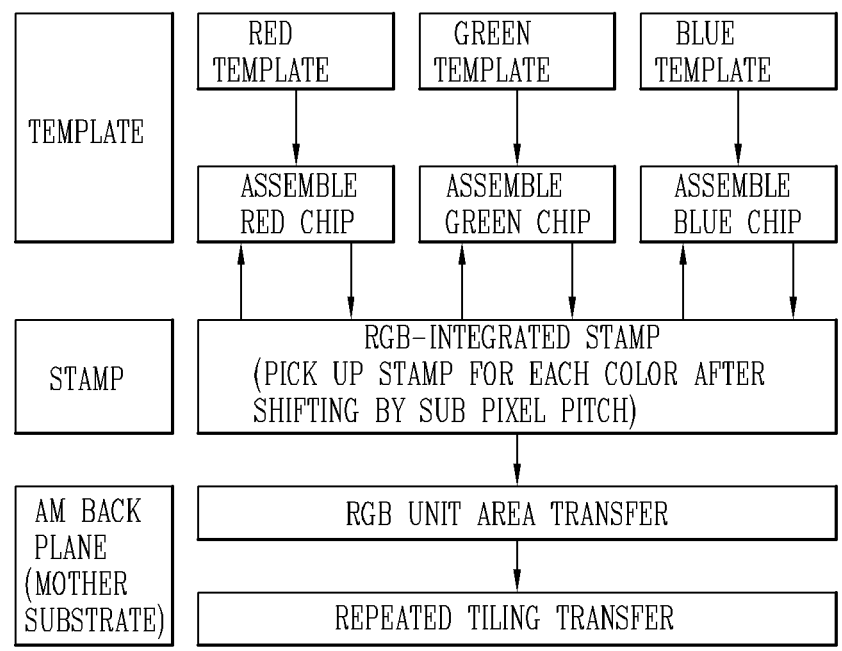
Figure 13:
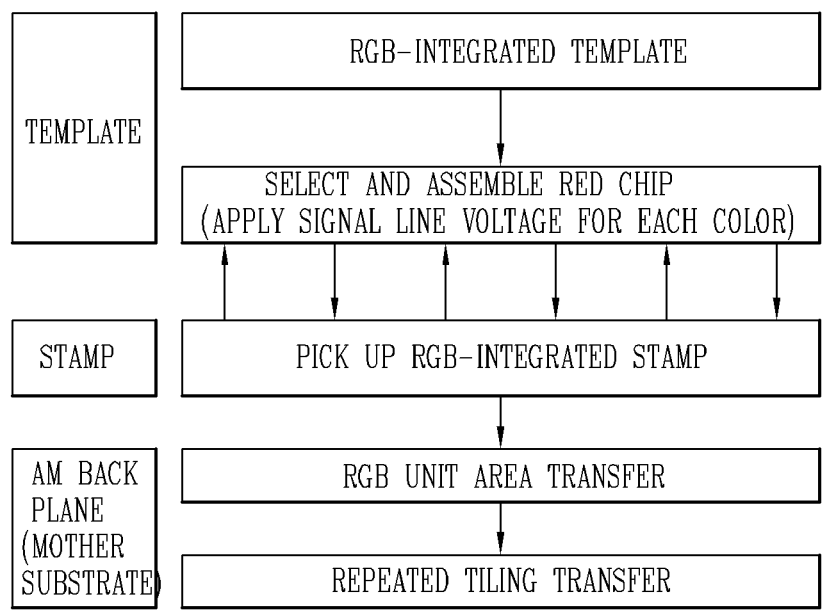

FIGS. 11 to 13 are flowcharts illustrating a method for manufacturing a display device including semiconductor light-emitting diodes that emit red (R), green (G), and blue (B) light.

Semiconductor light-emitting diodes emitting light of different colors may be individually assembled to different assembly substrates. Specifically, the assembly substrate 161 may include a first assembly substrate on which semiconductor light-emitting diodes emitting light of a first color are mounted, a second assembly substrate on which semiconductor light-emitting diodes emitting light of a second color different from the first color are mounted, and a third assembly substrate on which semiconductor light-emitting diodes emitting light of a third color different from the first color and the second color are mounted. Different types of semiconductor light-emitting diodes are assembled to assembly substrates, respectively, according to the method described in FIGS. 8A to 8E. For example, semiconductor light-emitting diodes emitting red (R), green (G), and blue (B) light may be assembled to the first to third assemble substrates, respectively.

Referring to FIG. 11, a RED chip, a GREEN chip, and a BLUE chip may be assembled respectively to first to third assembly substrates RED TEMPLATE, GREEN TEMPLATE, and BLUE TEMPLATE. In this state, the RED chip, GREEN chip and BLUE chip may be transferred to the wiring substrate by different transfer substrates, respectively.

Specifically, the step of transferring the semiconductor light-emitting to diodes, which are mounted on the assembly substrate, to the wiring substrate may include pressing a first transfer substrate (stamp R) onto the first assembly substrate RED TEMPLATE to transfer the semiconductor light-emitting diodes (RED chip) emitting the light of the first color from the first assembly substrate RED TEMPLATE to the first transfer substrate (stamp R), pressing a second transfer substrate (stamp G) onto the second assembly substrate GREEN TEMPLATE to transfer the semiconductor light-emitting diodes (GREEN chip) emitting the light of the second color from the second assembly substrate GREEN TEMPLATE to the second transfer substrate (stamp G), and pressing a third transfer substrate (stamp B) onto the third assembly substrate BLUE TEMPLATE to transfer the semiconductor light-emitting diodes (BLUE chip) emitting the light of the third color from the third assembly substrate BLUE TEMPLATE to the third transfer substrate (stamp B).

Thereafter, the step of pressing the respective first to third transfer substrates onto the wiring substrate to transfer the semiconductor light-emitting diodes emitting the light of the first to third colors from the first to third transfer substrates to the wiring substrate, respectively.

According to the manufacturing method according to FIG. 11, three types of assembly substrates and three types of transfer substrates are required to manufacture a display device including a RED chip, a GREEN chip, and a BLUE chip.

On the contrary, referring to FIG. 12, the RED chip, the GREEN chip, and the BLUE chip may be assembled to the first to third assembly substrates RED TEMPLATE, GREEN TEMPLATE, and BLUE TEMPLATE, respectively. In this state, the RED chip, GREEN chip and BLUE chip may be transferred to the wiring substrate by the same transfer substrate.

Specifically, the step of transferring the semiconductor light-emitting diodes, which are mounted on the assembly substrates, to the wiring substrate may include pressing a transfer substrate (RGB-integrated stamp) onto the first assembly substrate RED TEMPLATE to transfer the semiconductor light-emitting diodes (RED chip) emitting the light of the first color from the first assembly substrate RED TEMPLATE to the transfer substrate (RGB-integrated stamp), pressing the transfer substrate (RGB-integrated stamp) onto the second assembly substrate GREEN TEMPLATE to transfer the semiconductor light-emitting diodes (GREEN chip) emitting the light of the second color from the second assembly substrate GREEN TEMPLATE to the transfer substrate (RGB-integrated stamp), and pressing the transfer substrate (RGB-integrated stamp) onto the third assembly substrate BLUE TEMPLATE to transfer the semiconductor light-emitting diodes (BLUE chip) emitting the light of the third color from the third assembly substrate BLUE TEMPLATE to the transfer substrate (RGB-integrated stamp).

In this case, the alignment positions between the first to third assembly substrates and the transfer substrate may be different from each other. For example, when the alignment between the assembly substrates and the transfer substrate is completed, the relative position of the transfer substrate with respect to the first assembly substrate and the relative position of the transfer substrate with respect to the second assembly substrate may be different from each other. The transfer substrate may be shifted in its alignment position by a pitch of a sub pixel every time the type of the assembly substrate is changed. In this way, when the transfer substrate is sequentially pressed onto the first to third assembly substrates, all the three types of chips can be transferred to the transfer substrate.

Afterwards, similar to FIG. 11, the step of pressing the transfer substrate onto the wiring substrate to transfer the semiconductor light-emitting diodes emitting the light of the first to third colors from the transfer substrate to the wiring substrate is carried out.

According to the manufacturing method illustrated in FIG. 12, three types of assembly substrates and one type of transfer substrate are required to manufacture a display device including a RED chip, a GREEN chip, and a BLUE chip.

Unlike FIGS. 11 and 12, according to FIG. 13, a RED chip, a GREEN chip, and a BLUE chip may be assembled onto one assembly substrate (RGB-integrated TEMPLATE). In this state, each of the RED chip, GREEN chip and BLUE chip can be transferred to the wiring substrate by the same transfer substrate (RGB-integrated stamp).

According to the manufacturing method illustrated in FIG. 13, one type of assembly substrate and one type of transfer substrate are required to manufacture a display device including a RED chip, a GREEN chip, and a BLUE chip.

As described above, when manufacturing a display device including semiconductor light-emitting diodes emitting light of different colors, the manufacturing method may be implemented in various ways. Hereinafter, a structure of an assembly substrate for increasing the yield of the method for manufacturing the display device described with reference to FIGS. 10A to 100 and FIGS. 11 to 13 will be described.

Prior to explanation, an electric field formed between the assembly electrodes when the self-assembly is carried out, which has been described with reference to FIGS. 8A to 8E, will be described.

Figure 14:
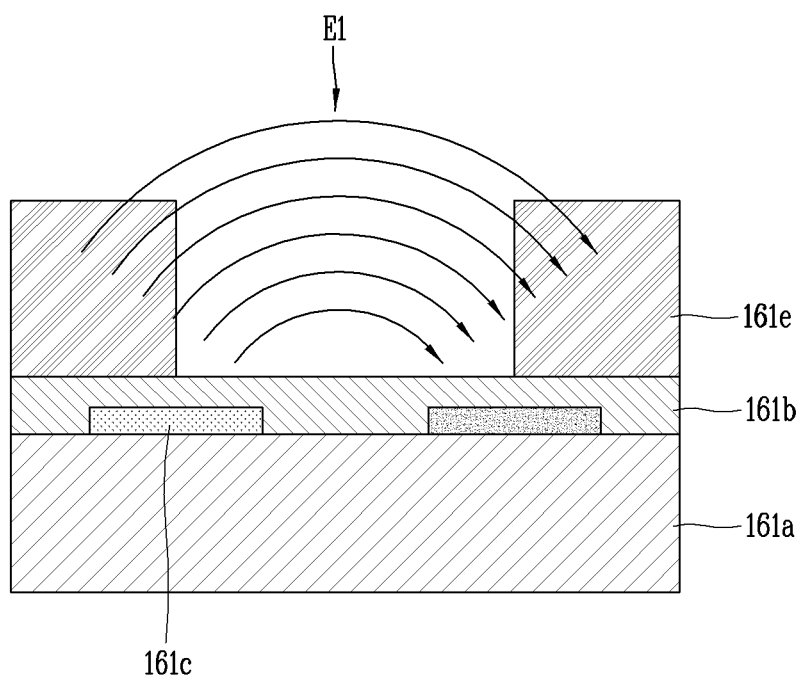
FIGS. 14 and 15 are conceptual diagrams illustrating the form of an electric field formed between assembly electrodes.
Figure 15:
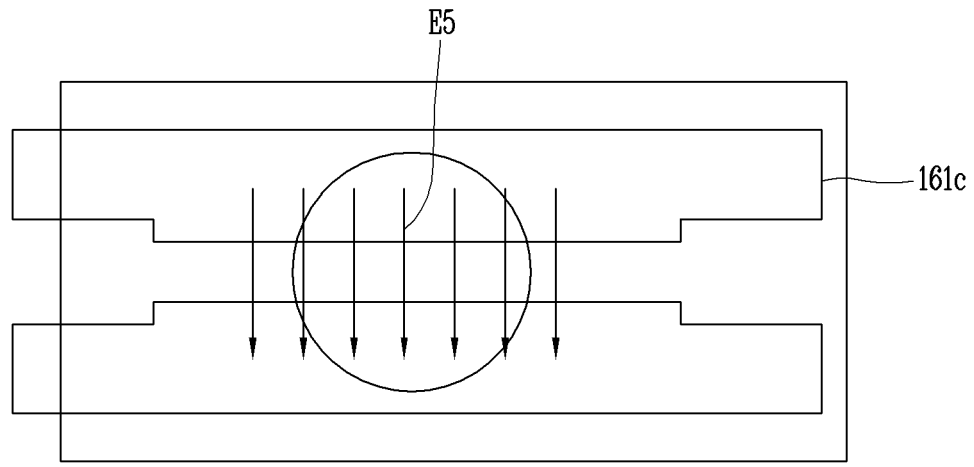

FIGS. 14 and 15 are conceptual diagrams illustrating the form of an electric field formed between assembly electrodes.

Referring to FIG. 14, when a voltage is applied to the assembly electrodes 161c, an electric field is formed between the assembly electrodes 161c. The electric field E1 becomes stronger near the assembly electrodes, and becomes weaker away from the assembly electrodes. The electric field may be strongly formed on surfaces of the barrier walls adjacent to the assembly electrodes.

Specifically, referring to FIG. 15, an area where the electric field is strongly formed, other than the recesses formed in the barrier wall 161e, may exist. For example, the electric field may be strongly formed on a surface of an area, which covers the assembly electrode 161c or a portion between the assembly electrodes, of the entire area of the barrier wall 161e. Accordingly, some of the semiconductor light-emitting diodes may stick to the surface of the barrier wall where the recesses are not formed.

In order to prevent such a problem, the thickness of the barrier wall 161e has no choice but to increase. Specifically, when the thickness of the barrier wall 161e is increased, the distance between the assembly electrodes and the barrier wall surface is increased, which may result in reducing the phenomenon of the semiconductor light-emitting diodes sticking to the barrier wall surface.

However, the increase in the thickness of the barrier wall may lower the yields of the process after the self-assembly. In an extreme case, when the thickness of the barrier wall is greater than the thickness of the semiconductor light-emitting diodes that are placed in the recesses, it makes it difficult to transfer the semiconductor light-emitting diodes placed on the assembly substrate to another substrate.

Figure 10B:
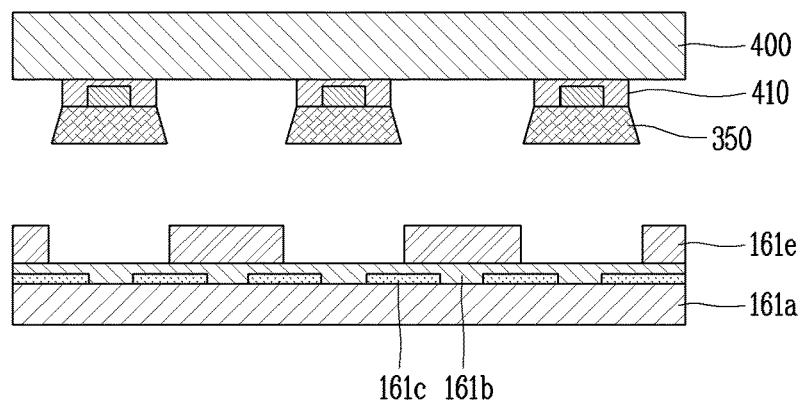
Figure 10C:
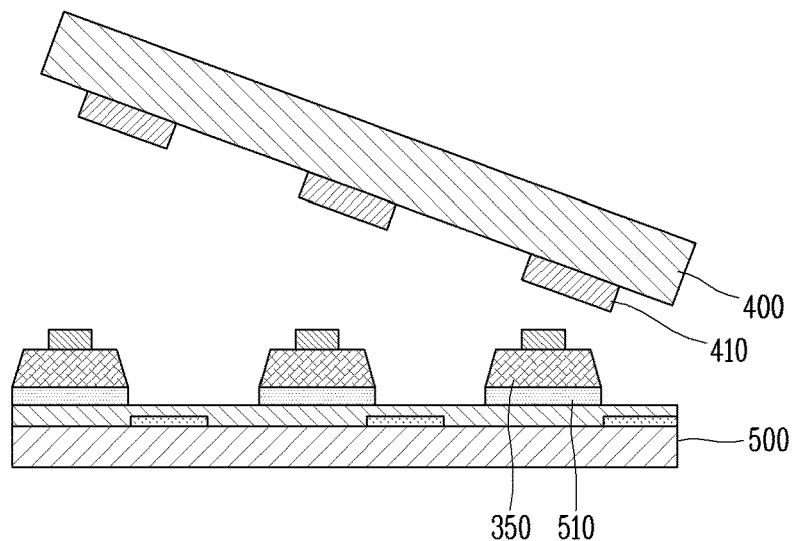

When the process after the self-assembly illustrated in FIGS. 10A to 10C is performed, the barrier wall interferes with the pressure applied by the transfer substrate to the semiconductor light-emitting diodes. As described above, in order to increase the yields of the process after the self-assembly, it is more advantageous that the barrier wall is thinner in thickness.

In summary, the self-assembly yields can be improved as the thickness of the barrier wall increases, but the process yields after the self-assembly decrease. On the other hand, as the thickness of the barrier wall decreases, the self-assembly yields may be reduced but the yields after the process of the self-assembly are improved.

The present disclosure provides a structure of an assembly substrate that can reduce the thickness of the barrier wall and improve the self-assembly yields. Hereinafter, a structure of an assembly substrate according to the present disclosure will be described.

Figure 16:
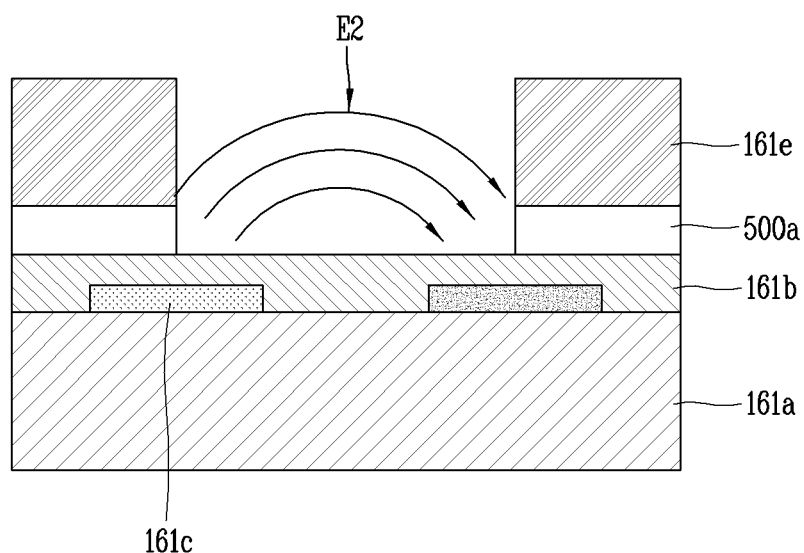
FIGS. 16 to 18 are conceptual views illustrating an assembly substrate according to the present disclosure.
Figure 17:
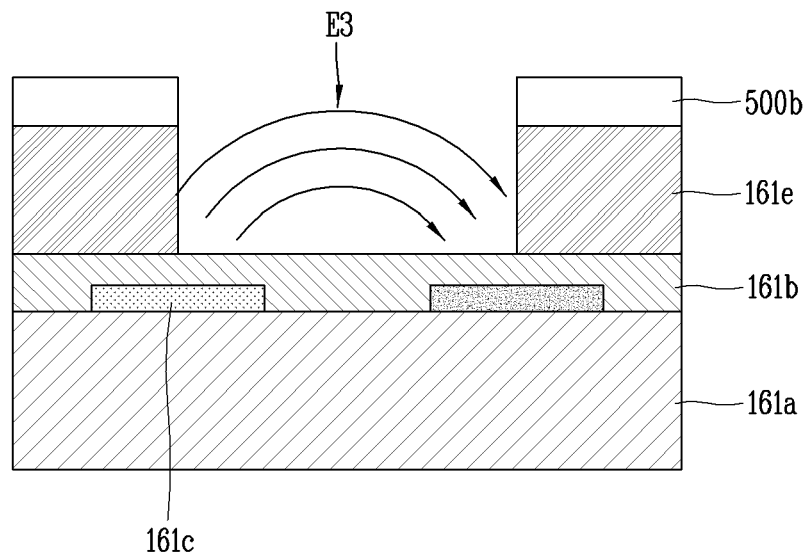
Figure 18:
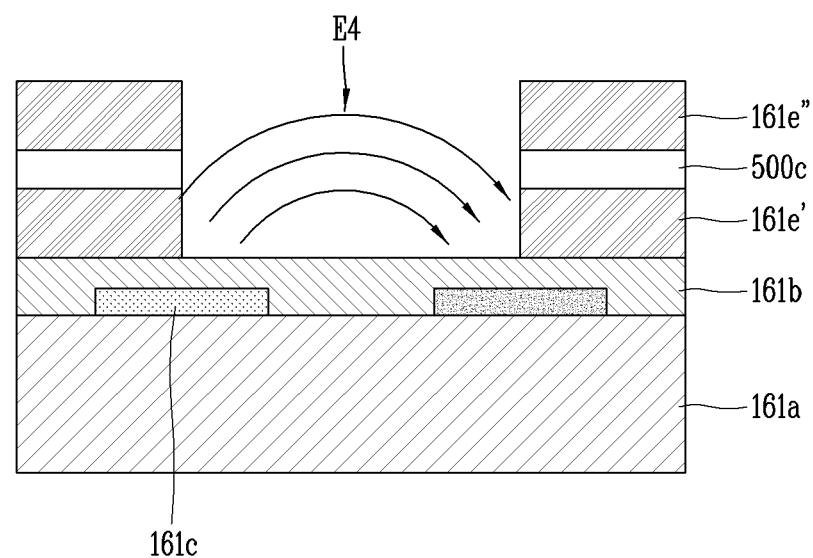
Figure 19:
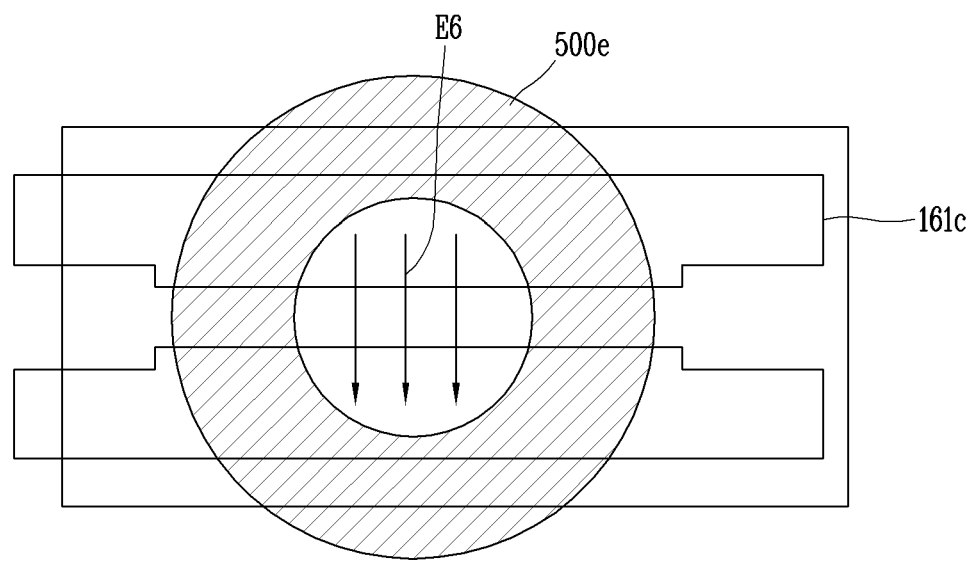
FIGS. 19 and 20 are conceptual views illustrating an assembly substrate according to the present disclosure, viewed from the top.
Figure 20:
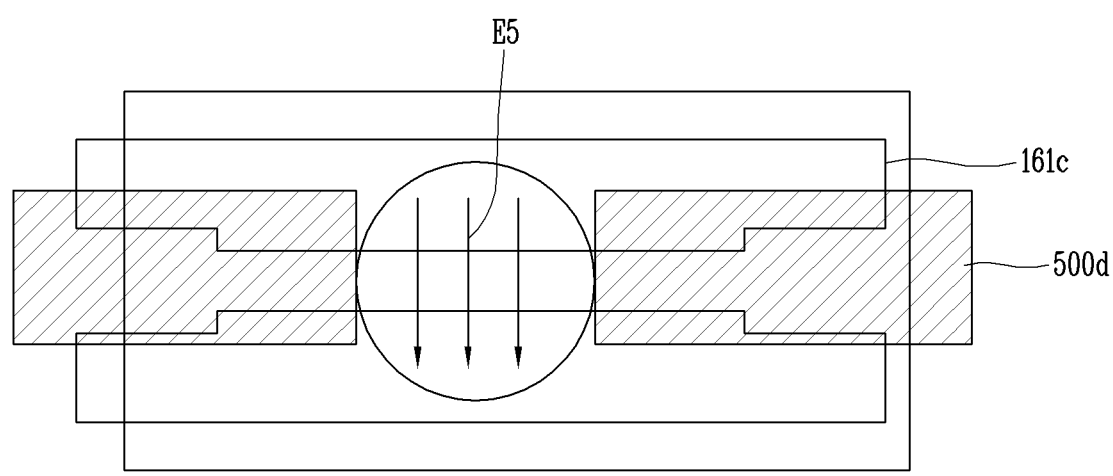

FIGS. 16 to 18 are sectional views of an assembly substrate according to the present disclosure, and FIGS. 19 to 20 are conceptual views of the assembly substrate according to the present disclosure, viewed from the top.

The assembly substrate according to the present disclosure may include, as aforementioned, the base portion 161a, the assembly electrodes 161c, the dielectric layer 161b, and the barrier wall 161e. The description thereof is replaced with the foregoing description.

Meanwhile, the assembly substrate according to the present disclosure includes a metal shielding layer formed on the base portion. The metal shielding layer is used for shielding an electric field formed between the assembly electrodes 161c.

The metal shielding layer is disposed to overlap the barrier wall so as to shield an electric field formed between the assembly electrodes 161c.

The metal shielding layer may be made of any one of Mo, Al, Ni, and Cr, or may be made of an alloy of the metals. However, the present disclosure is not limited thereto.

The thickness of the metal shielding layer is not particularly limited, but it is sufficient as long as the metal shielding layer can completely shield the electric field formed between the assembly electrodes.

The metal shielding layer may be formed at various positions. In one embodiment, referring to FIG. 16, the metal shielding layer 500a may be formed between the barrier wall 161e and the dielectric layer 161b.

The metal shielding layer 500a allows an electric field formed by the assembly electrodes to be formed only in the recess. As compared with an electric field E1 described in FIG. 14, it can be seen that an electric field E2 formed in FIG. 16 is concentrated only in the recess.

An insulated state must be maintained between the metal shielding layer and the assembly electrodes. When the metal shielding layer and the assembly electrodes are electrically connected to each other, the metal shielding layer cannot perform a shielding function. Accordingly, at least one type of insulating material should be disposed between the metal shielding layer and the assembly electrodes so that the insulated state between the metal shielding layer and the assembly electrodes is maintained.

When the metal shielding layer 500a is disposed as shown in FIG. 16, only the dielectric layer 161b is present between the metal shielding layer 500a and the assembly electrodes 161c. The dielectric layer 161b should be formed to have a sufficient thickness to maintain the insulated state between the metal shielding layer 500a and the assembly electrodes 161c.

In another embodiment, referring to FIG. 17, the barrier wall 161e may have a first surface in contact with the dielectric layer 161b and a second surface opposite to the first surface, and the metal shielding layer 500b may be disposed to cover the second surface. The metal shielding layer 500b may be disposed on an upper surface of the barrier wall 161e.

In this case, the metal shielding layer 500b may improve durability of the assembly substrate. Specifically, when the assembly substrate is used for the self-assembly multiple times, the barrier wall may be broken due to external pressure. When the metal shielding layer 500b covers the barrier wall, the metal shielding layer 500b can prevent breakage of the barrier wall 161e due to external pressure during the repeatedly performed self-assembly.

With the structure according to FIG. 17, since two types of insulating layers (the barrier wall and the dielectric layer) exist between the metal shielding layer 500b and the assembly electrodes 161c, the insulated state between the metal shielding layer 500b and the assembly electrodes 161c is maintained.

The metal shielding layer 500b allows an electric field formed by the assembly electrodes to be formed only in the recesses. It can be seen that an electric field E3 formed in FIG. 17 is concentrated only in the recesses when compared with the electric field E1 described in FIG. 14.

In another embodiment, referring to FIG. 18, the barrier wall includes a first barrier wall 161e' formed on the dielectric layer 161b and a second barrier wall 161e" formed on the first barrier wall 161e', and the metal shielding layer 500c may be disposed between the first and second barrier walls 161e' and 161e".

Since the first and second barrier walls 161e' and 161e" cover both surfaces of the metal shielding layer 500c, respectively, it is possible to prevent the metal shielding layer 500c from being oxidized by contact with the fluid during the self-assembly.

With the structure according to FIG. 18, since two types of insulating layers (the second barrier wall and the dielectric layer) exist between the metal shielding layer 500c and the assembly electrodes 161c, the insulated state between the metal shielding layer 500c and the assembly electrodes 161c is maintained.

The metal shielding layer 500c allows an electric field formed by the assembly electrodes to be formed only in the recesses. It can be seen that an electric field E4 formed in FIG. 18 is concentrated only in the recesses when compared with the electric field E1 described in FIG. 14.

As described above, the metal shielding layer may be disposed on at least one of the bottom of the barrier wall, an intermediate layer of the barrier wall, and the top of the barrier wall.

Meanwhile, the metal shielding layer may be disposed to overlap various areas of the barrier wall, the assembly electrodes, and the base portion.

The metal shielding layer may be disposed to overlap at least part of the remaining area, except for the areas where the recesses are formed, of the entire area of the barrier wall 161e. When the metal shielding layer is formed in the recesses, it may be likely to interfere with the self-assembly, and thus the metal shielding layer is preferably disposed outside the recess.

Meanwhile, the metal shielding layer may be formed on the edges of the recesses. A spacing may be generated between inner walls of the recess and the semiconductor light-emitting diode in a state where the semiconductor light-emitting diode is mounted in the recess. An unnecessary semiconductor light-emitting diode may be assembled in the spacing. The metal shielding layer disposed on the edge of the recess shields an electric field formed around the spacing, thereby preventing the semiconductor light-emitting diode from being assembled into the spacing.

Meanwhile, the metal shielding layer may be disposed to cover gaps between the assembly electrodes. Specifically, an electric field is strongly formed between the assembly electrodes. The recesses formed in the barrier wall are formed between the assembly electrodes so that the assembly electrodes can strongly attract the semiconductor light-emitting diodes. On the other hand, the areas where the recesses are not formed among the areas between the assembly electrodes are covered with the barrier wall. Even if areas between the assembly electrodes are covered with the barrier wall, the semiconductor light-emitting diodes may be mounted in the areas because the electric field is strongly formed in the areas. That is, the semiconductor light-emitting diodes may possibly be misassembled onto the surface of the barrier wall adjacent to the assembly electrodes. The metal shielding layer is disposed so as to cover the areas between the assembly electrodes where the electric field is strongly formed, thereby preventing the semiconductor light-emitting diodes from being to misassembled onto the surface of the barrier wall.

In a detailed embodiment, referring to FIG. 19, the metal shielding layer 500*d* may be formed in a bar-like shape covering the area between the assembly electrodes. In this case, one end of the metal shielding layer 500*d* may be disposed on the edge of the recess formed in the barrier wall. The metal shielding layer 500*d* allows an electric field E5 to be formed only inside the recess.

In another embodiment, referring to FIG. 20, the metal shielding layer 500*e* may be formed in an annular shape on the edge of the recess. The metal shielding layer 500*e* allows an electric field E6 to be formed only inside the recess. The metal shield layer 500*e* shields an electric field formed around the spacing between the semiconductor light-emitting diode and the inner walls of the recess, thereby preventing the semiconductor light-emitting diode from being assembled into the spacing.

On the other hand, the sum of the thickness of the barrier wall and the thickness of the metal shielding layer in a direction perpendicular to the assembly substrate is preferably smaller than the thickness of the semiconductor light-emitting diode that is mounted in the recess. Parts of the semiconductor light-emitting diodes should be exposed to the outside in a state where the semiconductor light-emitting diodes are mounted inside the recesses. When the semiconductor light-emitting diodes mounted on the assembly substrate are transferred to the transfer substrate by the method described with reference to FIGS. 10A to 10O, the parts of the semiconductor light-emitting diodes are exposed to the outside, so that pressure applied by the transfer substrate can be concentrated on the semiconductor light-emitting diodes.

As described above, since the assembly substrate according to the present disclosure comes with the metal shielding layer which completely shields an electric field at unnecessary positions, the thickness of the barrier wall does not need to be increased. Accordingly, the present disclosure enables the semiconductor light-emitting diodes to be smoothly separated from the assembly substrate during the process after the self-assembly.

What is claimed is:

1. An assembly substrate used for a display device manufacturing method of mounting semiconductor light-emitting diodes on the assembly substrate at preset positions using electric field and magnetic field, the assembly substrate comprising:
   a base portion;
   a plurality of assembly electrodes extending in one direction and disposed on the base portion;
   a dielectric layer stacked on the base portion to cover the assembly electrodes;
   a barrier wall formed on the base portion and having a plurality of recesses for guiding the semiconductor light-emitting diodes to the preset positions; and
   a metal shielding layer formed on the base portion,
   wherein the metal shielding layer overlaps the barrier wall so that an electric field formed between the assembly electrodes is shielded.

2. The assembly substrate of claim 1, wherein the metal shielding layer is disposed to overlap at least part of a remaining area, except for areas where the plurality of recesses is formed, of an entire area of the barrier wall.

3. The assembly substrate of claim 2, wherein the metal shielding layer is formed on edges of the plurality of recesses.

4. The assembly substrate of claim 2, wherein the metal shielding layer covers gaps between the assembly electrodes.

5. The assembly substrate of claim 1, wherein the metal shielding layer is disposed between the barrier wall and the dielectric layer.

6. The assembly substrate of claim 1, wherein the barrier wall comprises:
   a first barrier wall formed on the dielectric layer; and
   a second barrier wall formed on the first barrier wall,
   wherein the metal shielding layer is disposed between the first barrier wall and the second barrier wall.

7. The assembly substrate of claim 1, wherein the barrier wall comprises:
   a first surface in contact with the dielectric layer; and
   a second surface opposite to the first surface,
   wherein the metal shielding layer is disposed to cover the second surface.

8. The assembly substrate of claim 1, wherein a sum of a thickness of the barrier wall and a thickness of the metal shielding layer in a direction perpendicular to the assembly substrate is smaller than a thickness of the semiconductor light-emitting diode mounted in the recess.

9. The assembly substrate of claim 1, wherein at least one type of insulating material is disposed between the metal shielding layer and the assembly electrodes so that the insulated state between the metal shielding layer and the assembly electrodes is maintained.

10. A method for manufacturing a display device, the method comprising:
    feeding an assembly substrate having a plurality of assembly electrodes to an assembly site, and putting semiconductor light-emitting diodes into a fluid chamber;
    applying a magnetic force to the semiconductor light-emitting diodes so that the semiconductor light-emitting diodes move in one direction within the fluid chamber;
    applying a voltage to each of the assembly electrodes such that the semiconductor light-emitting diodes are guided onto preset positions by an electric field formed between the assembly electrodes while the semiconductor light-emitting diodes move along the one direction; and
    transferring the semiconductor light-emitting diodes placed on the assembly substrate onto a wiring substrate,
    wherein the assembly substrate is provided with a metal shielding layer disposed thereon for shielding an electric field so as to prevent the electric field from being formed in areas except for the preset positions.

11. The method of claim 10, wherein the transferring the semiconductor light-emitting diodes, placed on the assembly substrate, to the wiring substrate comprises:
    pressing the transfer substrate onto the assembly substrate to transfer the semiconductor light-emitting diodes from the assembly substrate to the transfer substrate; and
    pressing the transfer substrate onto the wiring substrate to transfer the semiconductor light-emitting diodes from the transfer substrate to the wiring substrate.

12. The method of claim 11, wherein the transfer substrate comprises a plurality of protrusions, and
    wherein the transferring the semiconductor light-emitting diodes from the assembly substrate to the transfer substrate is performed after aligning the assembly substrate and the transfer substrate so that the protrusions and the semiconductor light-emitting diodes overlap each other.

13. The method of claim 10, wherein the assembly substrate comprises a barrier wall having a plurality of recesses for guiding the semiconductor light-emitting diodes to the preset positions, and
wherein the metal shielding layer is disposed to overlap the barrier wall.

14. The method of claim 13, wherein the metal shielding layer is disposed to overlap at least part of a remaining area, except for areas where the plurality of recesses is formed, of an entire area of the barrier wall.

15. The method of claim 14, wherein the metal shielding layer is formed on edges of the plurality of recesses.

16. The method of claim 14, wherein a sum of a thickness of the barrier wall and a thickness of the metal shielding layer in a direction perpendicular to the assembly substrate is smaller than a thickness of the semiconductor light-emitting diode mounted in the recess.

17. The method of claim 10, wherein the assembly substrate comprises a first assembly substrate on which semiconductor light-emitting diodes emitting light of a first color are mounted, and a second assembly substrate on which semiconductor light-emitting diodes emitting light of a second color different from the first color are mounted,
wherein the transferring the semiconductor light-emitting diodes, placed on the assembly substrate, to the wiring substrate comprises:
transferring the semiconductor light-emitting diodes, placed on the first assembly substrate and emitting the light of the first color, to the wiring substrate; and
transferring the semiconductor light-emitting diodes, placed on the second assembly substrate and emitting the light of the second color, to the wiring substrate.

18. The method of claim 17, wherein the transferring the semiconductor light-emitting diodes, placed on the assembly substrate, to the wiring substrate comprises:
pressing the transfer substrate onto the first assembly substrate to transfer the semiconductor light-emitting diodes emitting the light of the first color from the first assembly substrate to the transfer substrate;
pressing the transfer substrate onto the second assembly substrate to transfer the semiconductor light-emitting diodes emitting the light of the second color from the second assembly substrate to the transfer substrate; and
pressing the transfer substrate onto the wiring substrate to transfer the semiconductor light-emitting diodes emitting the light of the first and second colors from the transfer substrate to the wiring substrate.

19. The method of claim 17, wherein the transferring the semiconductor light-emitting diodes, placed on the assembly substrate, to the wiring substrate comprises:
pressing a first transfer substrate onto the first assembly substrate to transfer the semiconductor light-emitting diodes emitting the light of the first color from the first assembly substrate to the first transfer substrate;
pressing a second transfer substrate onto the second assembly substrate to transfer the semiconductor light-emitting diodes emitting the light of the second color from the second assembly substrate to the second transfer substrate; and
pressing the first and second transfer substrates onto the wiring substrate to transfer the semiconductor light-emitting diodes emitting the light of the first and second colors from the first and second transfer substrates to the wiring substrate.

20. The method of claim 11, wherein the transfer substrate is a polydimethylsiloxane (PDMS) substrate.

* * * * *